US009209400B2

(12) United States Patent
Hayton et al.

(10) Patent No.: US 9,209,400 B2
(45) Date of Patent: Dec. 8, 2015

(54) LAYER-SELECTIVE LASER ABLATION PATTERNING

(75) Inventors: Carl Hayton, Cambridge (GB); Thomas Meredith Brown, Rome (IT); Paul A. Cain, Cambridge (GB)

(73) Assignee: FLEXENABLE LIMITED, Cambridge, Cambridgeshire (GB)

( * ) Notice: Subject to any disclaimer, the term of this patent is extended or adjusted under 35 U.S.C. 154(b) by 1281 days.

(21) Appl. No.: 11/915,731

(22) PCT Filed: May 30, 2006

(86) PCT No.: PCT/GB2006/050133
§ 371 (c)(1),
(2), (4) Date: Sep. 5, 2008

(87) PCT Pub. No.: WO2006/129126
PCT Pub. Date: Dec. 7, 2006

(65) Prior Publication Data
US 2009/0212292 A1 Aug. 27, 2009

(30) Foreign Application Priority Data

Jun. 1, 2005 (GB) .................................. 0511132.3
Jul. 8, 2005 (GB) .................................. 0513915.9

(51) Int. Cl.
*H01L 21/302* (2006.01)
*H01L 21/461* (2006.01)
(Continued)

(52) U.S. Cl.
CPC .......... *H01L 51/0023* (2013.01); *B23K 26/063* (2013.01); *B23K 26/409* (2013.01);
(Continued)

(58) Field of Classification Search
CPC . H01L 51/0023; H01L 51/5203; H01L 51/56;
H01L 51/0009; H01L 51/0097; H01L 51/102;
H01L 51/0545; H01L 51/0021; H01L 51/055;
H01L 21/268; H01L 21/76894; H01L
29/78681; H01L 27/1214; B23K 26/409;
B23K 26/063

USPC .................. 438/99, 149, 216, 642, 690, 669;
257/40, 66, 72, 57, E21.596
See application file for complete search history.

(56) References Cited

U.S. PATENT DOCUMENTS 4,081,653 A 3/1978 Koo et al.
4,684,437 A 8/1987 Donelon et al.
(Continued)

FOREIGN PATENT DOCUMENTS

EP 1 443 556 A2 8/2004
EP 1897157 A2 3/2008
(Continued)

OTHER PUBLICATIONS

Hosokawa, et al., "Femtosecond Multistep Laser Etching of Transparent Amorphous Organic Film," Japanese Journal of Applied Physics, vol. 40, No. 10B, part 2, Oct. 15, 2001, pp. L1116-L1118.
(Continued)

*Primary Examiner* — Shouxiang Hu
(74) *Attorney, Agent, or Firm* — Knobbe Martens Olson & Bear LLP

(57) ABSTRACT

A method of fabricating an organic electronic device is provided. The organic electronic device has a structure including an upper conductive layer and an underlying layer immediately beneath said upper conducting layer and having at least one solution process able semiconducting layer. The upper conducting layer preferably has a thickness of between 10 nm and 200 nm. The method includes patterning said upper conductive layer of said structure by: laser ablating said upper conductive layer using a pulsed laser to remove regions of upper conductive layer from said underlying layer for said patterning; and wherein said laser ablating uses a single pulse of said laser to substantially completely remove a said region of said upper conductive layer to expose said underlying layer beneath.

32 Claims, 13 Drawing Sheets

(51) Int. Cl.
| | |
|---|---|
| H01L 21/44 | (2006.01) |
| H01L 51/40 | (2006.01) |
| H01L 51/00 | (2006.01) |
| H01L 21/268 | (2006.01) |
| H01L 21/02 | (2006.01) |
| H01L 21/768 | (2006.01) |
| B23K 26/06 | (2014.01) |
| B23K 26/40 | (2014.01) |
| H01L 51/10 | (2006.01) |
| H01L 27/12 | (2006.01) |
| H01L 29/786 | (2006.01) |
| H01L 51/05 | (2006.01) |

(52) U.S. Cl.
  CPC ........ *H01L21/02675* (2013.01); *H01L 21/268* (2013.01); *H01L 21/76894* (2013.01); *H01L 51/102* (2013.01); *H01L 27/1214* (2013.01); *H01L 29/78681* (2013.01); *H01L 51/0017* (2013.01); *H01L 51/0021* (2013.01); *H01L 51/055* (2013.01); *H01L 51/0545* (2013.01)

(56) References Cited

U.S. PATENT DOCUMENTS

| | | | |
|---|---|---|---|
| 5,446,521 | A | 8/1995 | Hainsey et al. |
| 5,723,236 | A | 3/1998 | Inoue et al. |
| 5,972,543 | A | 10/1999 | Yokoyama et al. |
| 6,285,001 | B1 | 9/2001 | Fleming et al. |
| 6,719,916 | B2 | 4/2004 | Dubowski et al. |
| 2001/0015438 | A1 | 8/2001 | Callegari et al. |
| 2002/0102478 | A1 | 8/2002 | Hasegawa et al. |
| 2004/0075120 | A1* | 4/2004 | Wu et al. ................ 257/288 |
| 2004/0137142 | A1 | 7/2004 | Nishikawa |
| 2004/0149986 | A1 | 8/2004 | Dubowski et al. |
| 2004/0155948 | A1 | 8/2004 | Dinca et al. |
| 2005/0009248 | A1 | 1/2005 | Weng et al. |
| 2005/0106507 | A1 | 5/2005 | Bernds et al. |
| 2005/0211975 | A1* | 9/2005 | Kawasaki et al. ............ 257/40 |
| 2005/0279999 | A1* | 12/2005 | Lee et al. .................. 257/66 |
| 2009/0009812 | A1 | 1/2009 | Sirringhaus et al. |
| 2009/0212292 | A1 | 8/2009 | Hayton et al. |

FOREIGN PATENT DOCUMENTS

| | | |
|---|---|---|
| EP | 2463928 A2 | 6/2012 |
| JP | H9-293891 A | 11/1997 |
| JP | 10-263871 A | 10/1998 |
| JP | H11-123884 | 5/1999 |
| JP | H11-320166 A | 11/1999 |
| JP | 2000/208794 | 7/2000 |
| JP | 2000-208794 A | 7/2000 |
| JP | 2003-133690 A | 5/2003 |
| JP | 2003-258256 A | 9/2003 |
| JP | 2003-309266 | 10/2003 |
| JP | 2004-508731 | 3/2004 |
| JP | 2004-179542 | 6/2004 |
| JP | 2004-306127 | 11/2004 |
| JP | 2005-081420 | 3/2005 |
| JP | 2005-509298 | 4/2005 |
| WO | WO 98/53510 A1 | 11/1998 |
| WO | WO 99/10939 | 3/1999 |
| WO | WO 01/47043 | 6/2001 |
| WO | WO 03/041185 | 5/2003 |
| WO | WO 03/080285 | 10/2003 |
| WO | WO 2004/060600 | 7/2004 |

OTHER PUBLICATIONS

Noach et al., "Microfabrication of an electroluminescent polymer light emitting diode pixel array," Applied Physics Letters, vol. 69, No. 24, Dec. 9, 1996, p. 3650.

Partial International Search Report issued in corresponding International Application No. PCT/GB2006/050133.

Aug. 31, 2006 International Preliminary Report on Patentability for PCT/GB2006/050265.

Extended Search Report for EP Application No. 12157149.1 dated May 22, 2014 in 10 pages.

International Search Report issued in application No. PCT/GB2006/050265 on Nov. 27, 2006.

Jolic, et al., "Fabrication of three-dimensional inductor coil using excimer laser micromachining." Journal of Micromechanics and Microengineering, Institute of Physics Publishing, 13(5):782-789 (Sep. 1, 2003).

Haight, et al., "Femtosecond laser ablation and deposition of metal films on transparent substrates with applications in photomask repair", Proceedings of SPIE, vol. 5714, Mar. 21, 2005, pp. 24-36, XP055116749.

Translation of "Notice of Reasons for Rejection" issued on Mar. 4, 2014 for Japanese Patent Application No. JP 2012-281399.

Schrodner, et al., "Polymer field effect transistors made by laser patterning", Organic Electronics, Elsevier, Amsterdam, vol. 6, No. 4, May 31, 2005, pp. 161-167, XP027680009.

English Translation of Chinese Office Action mailed on Oct. 29, 2012 for Chinese Application No. 2006-800282675.

English Translation of Japanese Notice of Reasons for Rejection dated Jul. 3, 2012 for Japanese Patent Application No. 2008-514206 in 5 pages.

Summons to Attend Oral Proceedings on European Application No. 06744335.8, dated Mar. 7, 2013.

English translation of Korean Office Action in Korean Patent Application No. 10-2007-7028115, dated Feb. 12, 2013.

Bao et al, "High-Performance Plastic Transistors Fabricated by Printing Techniques," Chemistry of Materials, vol. 9, pp. 1299-1301, Jan. 1997.

Bao, "Materials and Fabrication Needs for Low-Cost Organic Transistor Circuits," Advanced Materials, vol. 12, pp. 227-230, 2000.

Brittain et al, "Soft lithography and microfabrication," Physics World, vol. 11, No. 5, pp. 31-36, May 1998.

Duan, "High-performance thin-film transistors using semiconductor nanowires and nanoribbons," Nature, vol. 425, pp. 274-278, Sep. 2003.

Ghandour et al, "Excimer ablation of ITO on flexible substrates for large format display", pp. 90-101, Proceedings 2002 SPIE, Photonics West.

Kagan et al, "Organic-Inorganic Hybrid Materials as Semiconducting Channels in Thin-Film Field-Effect Transistors," Science, vol. 286, pp. 945-947, Oct. 1999.

Katz et al, "Organic molecular solids as thin film transistor semiconductors," Journal of Materials Chemistry, vol. 7, pp. 369-376, 1997.

Laquindanum et al, "Synthesis, Morphology, and Field-Effect Mobility of Anthradithiophenes," Journal of the American Chemical Society, vol. 120, No. 4, pp. 664-672, Feb. 1998.

Ridley et al, "All-Inorganic Field Effect Transistors Fabricated by Printing," Science, vol. 286, pp. 746-749, Oct. 1999.

Rogers et al, "Low-voltage 0.1 µm organic transistors and complementary inverter circuits fabricated with a low-cost form of near-field photolithography," Applied Physics Letters, vol. 75, pp. 1010-1012, Aug. 1999.

Schrödner et al, "Polymer field effect transistors made by laser patterning," Organic Electronics, vol. 6, pp. 161-167, 2005.

Wu et al, "Single-shot Excimer Laser Ablation of Thick Polymer Resists on Metallic Substrates", AMP Journal of Technology, vol. 1, pp. 69-79, Nov. 1991.

English translation of Japanese Office Action in Japanese Patent Application No. JP 2008-514206, dated Jan. 22, 2013.

Search Report issued on Application No. GB 0513915.9, dated Nov. 9, 2005.

Schaefer, et al., "Ablation of PEDOT/PSS with excimer lasers for micro structuring of organic electronic devices," Synthetic Metals 161 (2011) pp. 1051-1057.

(56) References Cited

OTHER PUBLICATIONS

Basting, "Excimer Laser Technology Laser Sources, Optics, Systems and Applications" Lambda Physik, 2001 p. 151.

Musaev, et al., "UV laser ablation of parylene films from gold substrates," National Nuclear Security Administration's Kansas City Plant, Department of Physics, University of Missouri-Kansas City, Kansas City, in 15 pages, 2011.

Communication pursuant to Article 94(3) EPC issued on Apr. 12, 2013 for European Application No. 06 779 619.3.

Notice of Reasons for Rejection issued on Aug. 7, 2012 for Japanese Patent Application No. 2010-529697.

International Preliminary Report on Patentability issued on Oct. 6, 2009 for International Application No. PCT/GB2006/050133.

Communication pursuant to Article 94(3) EPC issued on Feb. 16, 2010 for European Application No. 06 7744 335.8-2203.

Decision to Refuse a European Patent Application issue on Jul. 16, 2013 for European Application No. 06 744 335.8-1552.

Office Action issued on Nov. 2, 2011 for Chinese Application No. 200680028267.5.

\* cited by examiner

A  B  C  D

LAYER-SELECTIVE LASER ABLATION PATTERNING

CROSS-REFERENCE TO RELATED APPLICATIONS

This application is the U.S. National Phase under 35 U.S.C. §371 of International Application No. PCT/GB2006/050133, filed May 30, 2006, designating the United States and published in English on Dec. 7, 2006, as WO 2006/129126, which claims priority to United Kingdom Application No. 0511132.3, filed Jun. 1, 2005 and United Kingdom Application No. 0513915.9, filed Jul. 8, 2005.

FIELD OF THE INVENTION

The present invention relates to methods of fabricating electronic devices such as thin film transistor (TFT) or diode structures using laser ablation for selective patterning.

DESCRIPTION OF RELATED ART

A route for achieving cost-effective electronics such as large area displays and RFID circuits at higher throughputs than are available using conventional inorganic semiconductor wafer processing is required within organic electronics. In order to achieve devices such as large area displays and high-speed logic circuits, conduction pathways in the form of electrodes and interconnects are required on more than one level within the device stack. In order to achieve the required conductivity for the conduction pathways, metallic conductive pathways layers are often necessary. However, in comparison with conventional inorganic semiconductor wafer processing, there are no known methods within organic electronics of providing metallic conductivity pathways at high throughputs, high resolutions (<10 µm) and without using a high temperature process (<80° C.) on flexible substrates. Various known processes satisfy some but not all of these requirements. For example, the technique of ink jet printing metal nano-particle solutions followed by laser annealing achieves high conductivity at low temperature, but is only capable of low resolution and low throughput. Similarly, the technique of thermal transfer printing has reasonably high resolution (~10 µm) and low process temperature but usually yields low conductivity or low throughput.

We will describe techniques using laser ablation which address this problem. Background material relating to laser ablation can be found in U.S. Pat. No. 4,081,653, US2005/0106507, and WO 03/080285, and in "Excimer ablation of ITO on flexible substrates for large format display", Osman A. Ghandour, Dan Constantinide, and Ron Sheets, Proceedings 2002 SPIE, Photonics West.

Many ablation processes occur over a time scale of ~≤1 ns; much shorter than the pulse length of a typical excimer laser, which is in the region of 30 ns. This means that a process of ablation using nanosecond (ns) lasers is not as localised as that of shorter pulsed lasers. This often results in there being a considerable level of thermal damage around the ablation site (the heat-affected zone, HAZ). This may extend many microns laterally around the ablated feature, depending on the optical penetration depth and heat diffusion length. The size of HAZ depends on the time duration of the laser pulse, and the energy per pulse. In principle, the longer the pulse duration the wider the heat-affected zone.

The HAZ may take the form of a discoloured halo around the ablation site, where the material properties are likely to be inadvertently destroyed or degraded within the area surrounding the ablated region. Therefore, both lateral and vertical material damage may occur around the area to be ablated. This is a significant problem if the substrate on which a particular layer is to be patterned by laser ablation already contains temperature or radiation sensitive active layers, such as semiconducting or conductive structures in buried, underlying layers of the substrate whose properties are degraded.

An especial problem seen when laser ablating material within electronic devices is the selective structuring of an upper layer which is positioned on top of underlying layers which may exhibit some absorption at the laser wavelength. In this situation it becomes very difficult to pattern the upper layer of the device by laser ablation without causing any damage to the lower layers or the surrounding regions of the system. Whilst this may not be a problem for some applications, for many applications in which patterning of fine features of electroactive layers is required and degradation of a multitude of surrounding and underlying areas needs to be avoided, this effect is undesirable. There is a particular problem when selectively patterning the various layers of organic transistor or diode devices when the lower layer(s) of the device may contain electroactive or UV sensitive layers. This is the case, for example, when attempting to pattern the upper metal electrodes of a device by laser ablation, where degradation of the previously deposited and patterned semiconducting layers and underlying electrodes needs to be avoided. Examples of such upper metal electrodes include the gate electrode of a top-gate organic TFT and the cathode layer of an organic LED.

The problem is acute with underlying solution process able semiconductor materials such as organic semiconductor materials (more examples are given later), which in general lack an extensive three-dimensional network of covalent bonds which would otherwise increase the ablation threshold. This is especially the case where a semiconducting layer is immediately beneath an overlying conductive layer which is to be patterned by ablation. Such a structure may be found, for example, in a diode and in a bottom-gate FET (field effect transistor).

A further damaging perimeter effect commonly observed, particularly during processes of ablation of metallic layers, is a burring edge effect around the ablation site caused by molten material reforming at the edges of the ablation site due to thermal dissipation. This may cause serious device performance issues within electronic devices, particularly when attempting to accurately define fine structure features of an electronic device by laser ablation, such as the underlying electrodes of a device. An example is the source and drain electrodes of all organic TFT from which charges are injected into the active semiconducting layer. In the case of a TFT the presence of a burring edge deteriorates the injection of charges from the metal electrode into the semiconducting film leading to significant increase in contact resistance. Also, for example, the burring edges may rise through the overlying layers of the device to cause electrical shorts.

The AMP Journal of Technology, Vol 1, November 1991, pages 69-79, J. C. Wu et al., "Single-Shot Excimer Laser Ablation of Thick Polymer Resists on Metallic Substrates" describes techniques for laser ablation of a dielectric film on a metal substrate, but this presents special problems different to those addressed by embodiments of the present invention. In particular one of the problems is that for a perfect metal the transverse electric field amplitude vanishes at the metal surface so that ablation leaves a thin layer of polymer adjacent to the underlying metal; another is that the high thermal conductivity of metals effectively heat sinks the overlying polymer layer. Techniques for ablation on high thermal conductivity substrates are also described in JP2003/133690.

Techniques for ablation of an indium tin oxide (ITO) layer over amorphous silicon are described in JP2000/208794. Use of laser ablation to manufacture a dielectric mask is described in JP10-263871. U.S. Pat. No. 4,684,437 describes the use of fluences of greater than 1 J/cm$^2$, preferably greater than 3 or J/cm$^2$ per pulse to provide differential etching of copper over a polymer. A paper by Schrödner et al. (Organic Electronics 6 (2005) 161-167) describes the use of a few laser pulses to pattern a source-drain layer of a top-gate polymer FET—bottom-gate and similar devices are not mentioned—but does not describe how to pattern an upper conductive layer. Moreover, the transfer characteristics of the transistors they fabricated are poor, capable of improvement by orders of magnitude.

SUMMARY OF THE INVENTION

We will describe methods of fabricating electronic devices using techniques of laser ablation to remove material from a conductive layer of a multilayer structure without causing any significant degradation to an underlying layer. With this technique (by contrast with the ultra-short pulse technique described later) only use of a single laser pulse is able to guarantee substantially no degradation of the underlying layer. This is because with even two laser pulses the technique becomes indeterminate and parts of the underlying layer can be destroyed.

According to a first aspect of the present invention there is therefore provided a method of fabricating an organic electronic device, said organic electronic device having a structure including an upper conductive layer and an underlying layer immediately beneath said upper conductive layer and having at least one solution process able semiconducting layer, the method comprising patterning said upper conductive layer of said structure by: laser ablating said upper conductive layer using a pulsed laser to remove regions of upper conductive layer from said underlying layer for said patterning; and wherein said laser ablating uses a single pulse of said laser to substantially completely remove a said region of said upper conductive layer to expose said underlying layer beneath.

The inventors have recognised that use of a single laser pulse has special advantages not achieved with even two laser pulses. Thus in embodiments of the method a single laser pulse will remove all the overlying layer without any significant degradation of the underlying layer, even when the latter is very radiation sensitive, in embodiments even more sensitive than the ablated layer. This is not seen when attempting to use two laser pulses to achieve the same end because there is no defined 'end point' for the ablation. Apparently (without wishing to be bound by theory) when ablating using a single pulse the process is effectively self limiting, perhaps because the intense pulse creates a plasma which does not penetrate significantly into the underlying layer and which protects the underlying layer.

Preferably the single laser pulse has a fluence of less than 200 mJ/cm$^2$ or in the range 10 mJ/cm$^2$ to 200 mJ/cm$^2$. Preferably the pulse has a length of less than 100 ns or less than 10 ns. Preferably the laser has a wavelength of less than 400 nm. The upper conductive layer may have a thickness of between 10 nm and 200 nm. In some preferred embodiments of the method the thickness of the upper conductive layer is less than 150 nm, 100 nm or 50 nm and the fluence of the single laser pulse is less than 150 mJ, or less than 100 mJ. The upper limit of thickness of the upper conductive layer may also be extended beyond 200 nm, for example to 250 nm, 300 nm, 350 nm, 400 nm, 500 nm and above, for example 600 nm, 700 nm, 800 nm, 900 nm or 1000 nm. In such cases the fluence of the laser pulse may be increased accordingly, to greater than 200 mJ/cm$^2$. In embodiments a lower limit of thickness of the upper conductor layer may be 10 nm.

In embodiments of the method the underlying layer is substantially undamaged by the ablating, for example exhibiting a less than 10% or less than 5% loss in thickness. More particularly, however, high performance devices may be fabricated, as described further below.

In embodiments the fluence of the laser pulse may be greater than an ablation threshold of the underlying layer and, optionally, greater than an ablation threshold of 1 or more layers beneath the underlying layer, apparently because of shielding and light absorption effects by the ablated material/plasma. Where the underlying layer is substantially transparent to the laser a lower conducting layer may, nonetheless, remain substantially undamaged. In embodiments of the method the upper conductive layer may have an optical density (OD) greater than that of the underlying layer at a wavelength of the laser pulse—for example the conductive layer may have an OD of greater than 1 and the underlying layer may have an OD of less than 1.

In a first set of embodiments of the method the underlying layer comprises an organic dielectric layer, for example a gate insulation layer of a thin film transistor (TFT), more particularly a top gate TFT. Embodiments of the method we describe enable the fabrication of a thin film field effect transistor (FET) which has a ratio of off resistance to on resistance of greater than 10$^4$, more preferably greater than 10$^5$. Such a ratio may be measured for two different gate voltages for substantially the same drain-source voltage, for example at Vds=−1, −2, −5, −10, or −15V. Gate voltages of Vgs=−40V and +20V may be employed or, alternatively, lower voltages such as −20V and +10V or 10V and +5V.

In general it has been found advantageous to employ a dielectric stack, that is a plurality of dielectric layers rather than a homogeneous layer of dielectric material. This is because use of a dielectric stack facilitates the tailoring of the stack according to the desired characteristics at various levels within the stack. This technique is particularly advantageous where the overlying conducting layer is relatively thick, for example greater than 200 nm, to safeguard the single-shot technique at the larger laser fluences employed for such thicknesses. For example, towards the top of the stack, or immediately beneath the upper conductive layer, a relatively absorbing and/or damage resistant dielectric material such as parylene may be employed, although this is not in itself a particularly good electrical dielectric because it tends to have pinholes. In some embodiments of the method at least one of the dielectric layers within the stack comprises parylene. At one or more lower levels of the stack a dielectric material may be employed which has better dielectric properties but perhaps has a lower damage or ablation threshold or is less absorbing (and hence less protective of an underlying conductive layer). For example one or more lower layers of the stack may comprise polystyrene and/or PMMA (polymethyl methacrylate). In some embodiments, additionally or alternatively to parylene, an upper layer of the stack may comprise PVP (polyvinyl pyrrolidone). In general where a dielectric stack is employed one or more upper layers of the stack may have a higher ablation threshold or absorption than one or more lower layers of the stack. In embodiments one or more lower layers of the stack may have a better electrical dielectric response, for example a larger dielectric constant or a lower dielectric absorption, than an upper layer of the stack.

In a second set of embodiments the solution process able semiconducting layer is the underlying layer and thus this is immediately beneath (and in direct contact with) the upper conductive layer. Electronic devices which may be fabricated according to this set of embodiments of the method include a bottom-gate thin film transistor and a diode, in particular an organic diode. In the former case the upper conductive layer comprises a source-drain layer of the TFT in direct contact with the semiconductor, which preferably has a thickness of greater than 30 nm. In the latter case a diode typically employs a greater thickness of semiconducting material, for example greater than 100 nm, 200 nm or 300 nm. However similar thicknesses of semiconducting material may also be used with a bottom gate TFT structure. Where the electronic device fabricated comprises a diode, preferably this has a rectification ratio of greater than $5 \times 10^3$, more preferably $10^4$, most preferably $10^5$. The ratification ratio may be measured at a fixed voltage, for example 1, 2, 5, 10 or 15 volts.

In some particularly preferred embodiments the method is employed for fabricating an organic electronic device on a flexible substrate. Although solution process able semiconducting material is employed, preferably the upper conductive layer (and in embodiments a lower conductive layer) comprises an inorganic metal, preferably with a resistivity of less than 100 μΩcm, more preferably less than 50 μΩcm.

The invention further provides an organic thin film field effect transistor (FET) comprising a substrate bearing a lower conductive layer and an upper conductive layer, and with a layer of solution process able semiconducting material and a layer of organic dielectric material between said lower and upper conductive layers, wherein said upper conductive layer is patterned by laser ablating said upper conductive layer using a pulsed laser to remove regions of said upper conductive layer, wherein said laser ablating uses a single pulse of said laser to substantially completely remove a said region of said upper conductive layer, and wherein said FET has a ratio of off resistance to on resistance of greater than $10^4$.

The invention further provides a diode comprising a substrate bearing a lower conductive layer and an upper conductive layer, and with a layer of solution process able semiconducting material between said lower and upper conductive layers, wherein said upper conductive layer is patterned by laser ablating said upper conductive layer using a pulsed laser to remove regions of said upper conductive layer, wherein said laser ablating uses a single pulse of said laser to substantially completely remove a said region of said upper conductive layer.

In a related aspect the invention provides a method of fabricating an organic electronic device, said organic electronic device having a structure including an upper conductive layer and a solution process able semiconducting layer immediately beneath said upper conductive layer, the method comprising patterning said upper conductive layer of said substrate by: laser ablating said upper conductive layer using a pulsed laser to remove regions of upper conductive layer from said semiconducting layer for said patterning: and wherein said laser ablating uses a single pulse of said laser to substantially completely remove a said region of said upper conductive layer to expose said semiconducting layer beneath.

In a further related aspect the invention provides a method of fabricating an organic electronic device on a flexible substrate, said organic electronic device having a structure including an upper conductive layer and an underlying layer immediately beneath said upper conducting layer and with at least one solution process able semiconducting layer, the method comprising patterning said upper conductive layer of said structure by: laser ablating said upper conductive layer using a pulsed laser to remove regions of upper conductive layer from said underlying layer for said patterning; and wherein said laser ablating uses a single pulse of said laser to substantially completely remove a said region of said upper conductive layer to expose said underlying layer beneath.

In embodiments the upper conducting layer has a thickness of between 10 nm and 200 nm; preferably the single laser pulse has a fluence of less than 200 mJ/cm². The underlying layer may comprise the solution process able semiconducting layer so that this layer is immediately beneath the upper conducting layer. Alternatively the underlying layer may be a dielectric layer, in embodiments with an optical density of less than that of the upper conductive layer. For example, the dielectric layer may comprise a material which, for a thickness of 1 μm has an absorption coefficient of less than $10^6$ $m^{-1}$, or less than $10^5$ $m^{-1}$.

In some preferred embodiments of the method the structure includes a lower conductive layer beneath the at least one organic layer and supported on a substrate (which term is here used to include one or more layers which may be present between the lower conductive layer and a supporting substrate). Preferably in such structures an adhesion between the upper conductive layer and the at least one organic layer immediately beneath is less than an adhesion between the lower conductive layer and the substrate (which may include further layers beneath the lower conductive layer). This facilitates single-shot ablation of the upper conductive layer.

In some preferred embodiments the upper conductive layer comprises a metal layer or bi-layer, for example a gold layer, and the single laser pulse has a wavelength of less than 400 nm and a fluence in the range 10 mJ/cm² to 200 mJ/cm². The electronic device may comprise a thin film transistor (TFT) in which case the upper conductive layer may comprise a gate electrode layer or a drain-source electrode layer of the transistor.

According to a still further aspect the invention provides a method of fabricating an organic electronic device on a substrate, said organic electronic device having a structure including all upper conductive layer and an underlying layer immediately beneath said upper conducting layer and with at least one solution process able semiconducting layer, the method comprising patterning said upper conductive layer of said structure by laser ablation, and wherein said laser ablating comprises repeatedly removing portions of said layer of material at substantially the same spatial position to expose said underlying layer using repeated laser pulses, each said pulse having a duration of less than 1 ns.

In preferred the embodiments the pulse has a duration of less than, in order of increasing preference, 1 ns, 100 ps, 10 ps, 1 ps and 100 fs.

In preferred embodiments the upper conductive layer comprises a thin metal film, such as the gate electrode of a top-gate TFT (for which accurate, high resolution patterning is desirable), and the underlying organic layer comprises a polymer dielectric layer, such as the gate dielectric layer of a top-gate TFT, in which case the laser ablation is preferably continued until a thin layer (for example less than 100 nm, 10 nm or 1 nm) of the organic layer has been removed. Preferably the organic layer and/or substrate has a thermal conductivity of less than $10^{-2}$ W/cm·K. In some preferred embodiments the method is used to fabricate a device in a flexible substrate.

In another preferred embodiment of the upper conductive layer comprises a drain-source layer of a bottom-gate thin film transistor (for which accurate, high resolution patterning is desirable) and the underlying organic layer comprises a conjugated polymer semiconductor or small molecule organic semiconductor active layer (bottom-gate, top-contact configuration) or an organic gate dielectric layer (bottom-gate, bottom-contact configuration).

In yet another preferred embodiment the upper conductive layer comprises a thin metal film, such as the cathode electrode of an organic light-emitting, light-sensing or rectifying diode, and the underlying organic layer comprises a conjugated polymer semiconductor or small molecule organic semiconductor.

In some particularly preferred applications of the method an initial stage of laser ablation is followed by a higher resolution patterning stage employing one or more ultra-short laser pulses, as described above. The initial lower resolution laser ablation stage preferably comprises the above-described single-shot patterning technique. The ultra-short pulse ablation may be used to remove edge burring of the conductive layer created by the initial, lower-resolution stage of laser ablation.

The invention further provides a method of fabricating an electronic device such as a thin film transistor, diode, active matrix display, sensor or active matrix backplane, solar cell or OLED. Such a device may be fabricated by a method incorporating one or more methods according to the invention, as described above.

Features of the embodiments of the aspects of the invention described above may be combined in any permutation.

BRIEF DESCRIPTION OF THE DRAWINGS

To help understanding of the invention, specific embodiments thereof will now be described by way of example and with reference to the accompanying drawings, in which.

DETAILED DESCRIPTION OF PREFERRED EMBODIMENTS

Figure 1:
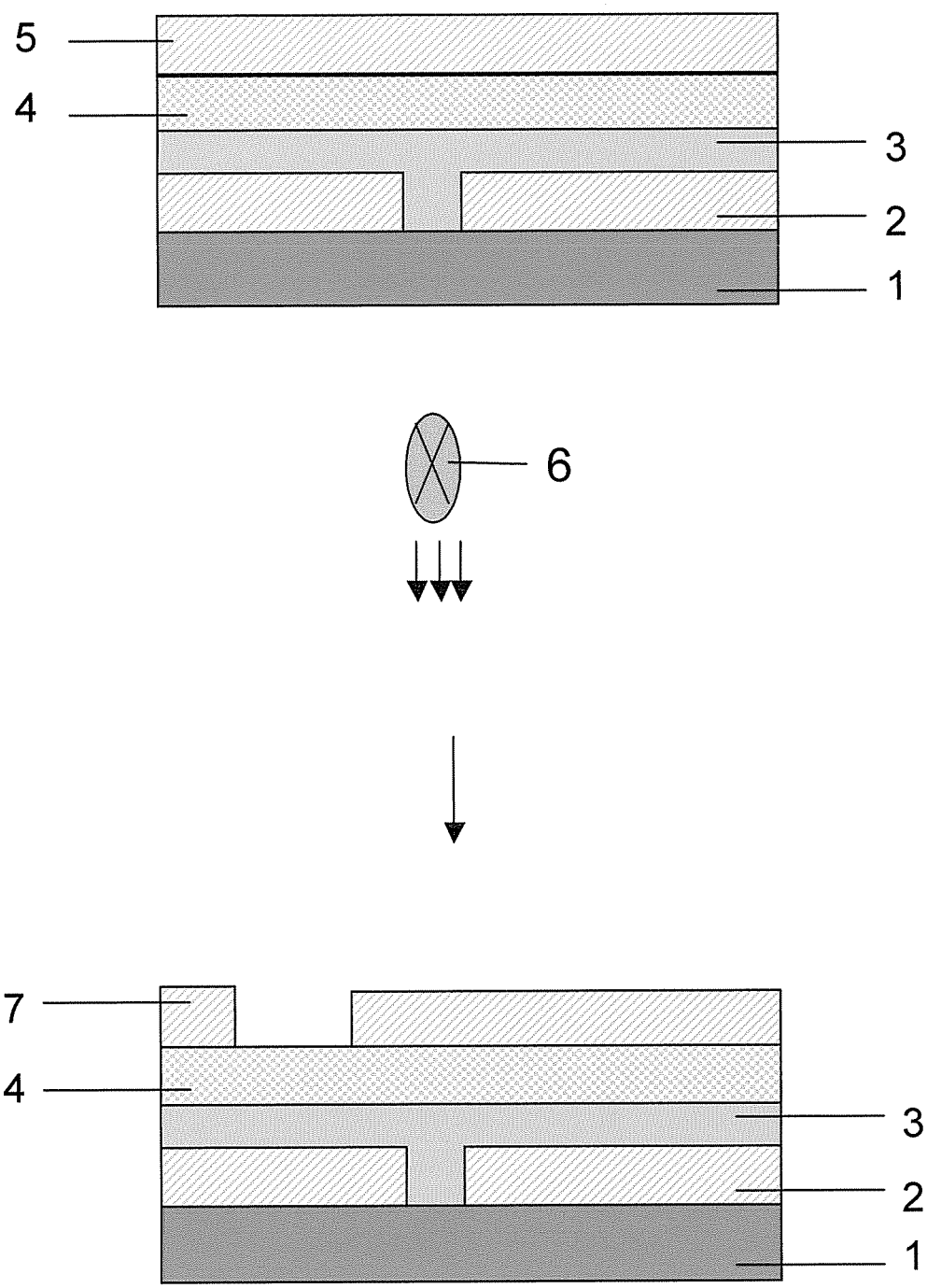
FIG. 1 shows a method of producing a device using an excimer laser for fabrication of an upper layer gate electrode of a thin film transistor according to a first embodiment of the present invention.

We first provide an overview of the techniques and then describe some examples.

We describe methods of fabricating thin film transistor (TFT) structures and diode structures by laser ablation for layer-selective patterning to achieve both coarse and fine features of high resolution and high throughput, using a low temperature process. Embodiments allow controlled patterning of upper metallic layers, with very high selectivity for the layer to be ablated while the materials properties of radiation and temperature sensitive active organic materials in underlying layers that are separated by less than 1 μm from or in contact with the layer to be ablated remain substantially undegraded.

In a preferred embodiment of the present invention a method is provided of patterning an upper conductive layer of an electronic device on top of at least one organic layer using a single shot of a nano-second laser beam (that is having a pulse length of greater than 1 n, 5 ns or 10 ns), preferably from an excimer laser in order to selectively pattern features the upper conductive layer. The use of a single laser pulse ensures that essentially all the laser energy is absorbed by the material of the upper conductive layer, and that the residual laser radiation to which the underlying organic and/or conductive layers are exposed is insufficient to ablate, damage or degrade the latter. This process allows for selective patterning of upper layers of a device without causing damage to active underlying features (for example a significant degradation in performance and/or greater than say 10% loss in thickness of an underlying layer).

It has been found that the use of a single shot exposure ensures that even if a long pulse duration laser, such as a is excimer laser, is used only the upper conductive layer is removed from the substrate, that is single-shot ablation is self-limiting, and does not result in ablation of any of the underlying layers on the substrate. The underlying layer structure generally includes another conductive layer which was patterned in a previous step, and is not to be damaged or ablated during the step of patterning the upper layer.

To avoid the damage or ablation of the lower conductive layer during laser ablation of the upper layer (which can be made of the same metal) the structure to be patterned by laser ablation is preferably constructed in the following way: The thickness of the upper conductive layer is chosen to be below 150-200 nm in order to allow ablation in a single shot, but sufficiently thick such that the optical density of the upper conductive layer is sufficiently high to shield any of the radiation sensitive layers in lower layers from the laser light, and to keep the energy density absorbed in any of the lower layers below their respective ablation thresholds. However, because of the mechanism of the ablation process it has been found that the fluence of the laser pulse may nonetheless be greater than an ablation threshold of the underlying layer without significant damage of the underlying layer. Notwithstanding this, preferably, the upper conductive layer is thicker than 10 nm, and its optical density at the wavelength of the laser is preferably higher than 1.

The intensity of the laser radiation is thus preferably selected to be above the ablation threshold for the upper layer, but also such that the amount of laser radiation to which the underlying layer (which is shielded by the upper conductive layer) is exposed is below the damage threshold of any of the lower layers. If the energy density is selected too high, the residual energy (described further later) impinging onto the lower layers causes damage or ablation of the lower conductive layer once most or all of the upper conductive layer has been removed and no longer shields the lower layers from the laser light during the remainder of the pulse.

In between the upper and lower conductive layer the substrate comprises organic material with a small optical density at the laser wavelength. Preferably, the organic material comprises an organic polymer layer or layers (stack) with an absorption coefficient of $\leq 10^5$ m$^{-1}$ at the preferred laser wavelength (corresponding to an optical density of order $\leq 0.1$ for a 1 μm thick layer). The low optical density of the organic material causes the energy density required for ablation of the organic material to be significantly higher than that of the strongly absorbing conductive layer. Typically the ablation threshold of the dielectric layer is in the range 50-200 mJ cm$^{-2}$, for example around 100 mJ cm$^{-2}$.

As an example, within a TFT device consider a 50 nm upper layer of gold (which has an absorbance (optical density) of about 4) that has been evaporated onto a 600 nm PMMA layer. This thickness of PMMA has an absorbance (optical density) of 0.05 and the ablation threshold is around 100 mJ cm$^{-2}$ (many polymers have poorly defined ablation thresholds, so that a small amount of etching may occur for lower fluences than this).

A 100 mJ cm$^{-2}$ spatially uniform (within 10%) laser pulse is then fired at the gold layer (248 nm, 30 ns laser pulse) from an excimer laser. This is well above the ablation threshold (delamination threshold) for the gold. Up to the point in time of ablation of the gold layer, nearly all of the laser energy is absorbed in the upper gold layer, since the optical density is so high (in the order of 4). After the onset of laser ablation in the gold, the plasma and debris particles that exist immediately above the gold-air interface shield the substrate from further damage by reflecting and absorbing the laser beam. The remaining fluence that is able to reach the underlying PMMA layer is thus a fraction of the applied fluence, and well below the ablation threshold of the PMMA. Some heating of the PMMA may occur, but it is not ablated.

Preferably, the dielectric and/or substrate layer also has a low thermal conductivity, in order to minimize diffusion of heat to any heat-sensitive lower layer. Preferably, the heat conductivity of the dielectric layer and/or substrate is less than $1 \cdot 10^{-2}$ W/cm·K.

In order to avoid damage to the underlying layer and aid the ablation at a relatively low laser fluence it is also advantageous to select the top conductive layer such that it exhibits relatively poor adhesion to the underlying material, such as, for example, in the case of a layer of gold deposited onto a layer of polymer.

As a further example, consider a 50 nm copper layer (optical density ~4 at 248 nm) that has been evaporated onto a 300 nm organic semiconductor layer, such as a polyfluorene. Beneath this semiconductor layer, a further conductive layer is provided of a metal with a different work function, such as gold. An 80 mJ cm$^{-2}$ spatially uniform (within 10%) laser pulse is then fired at the (upper) copper layer, in a similar manner to that described for the previous example. The copper is ablated without damage or ablation of the underlying semiconductor layer (which would have been ablated if the laser pulse had impinged directly upon it). By patterning the copper into contact pads, diode structures can be formed, using the gold and copper electrodes as contacts.

We also describe a method for producing a device using one or multiple shots of a low energy ultra short pulse laser for the fabrication of fine features within thin film transistor (TFT) or diode device structures. This process allows controlled patterning and fine tuning with very high selectivity and provides an added advantage of protecting the underlying layers and regions within a lateral and vertical direction of the device layer. This technique may be used to remove small area thin portions of a layer.

A particular aim is laser ablation using a short pulse laser to pattern layers of metallic material on top of underlying layers in order to produce fine features of a TFT device. An example is the patterning of a metal gate electrode of a top-gate organic TFT with underlying gate dielectric, active semiconductor and conducting source-drain electrode layers. This technique may be performed without destroying or substantially degrading the performance of these sensitive elements, such as the semiconductive layer and the source-drain electrodes. This is due to the short pulse length allowing all of the energy of an ultra-short laser beam to enter the material and to be absorbed within the layer to be ablated which will result in the act of ablation before any substantial thermalization actually occurs.

In addition, this technique may be used to finely tune the source and drain electrode formation after a coarser laser ablation process, for example the single-shot process described above, resulting in the substantial elimination of burred edges in a conductive layer that could lead to electrical shorts. This technique may also be used more generally to remove small areas of unwanted conductive material, for example, that have been formed as a result of the production of debris.

In more detail an ablation technique using a beam from an ultra-short ps) pulse laser allows multiple shot ablation processes to occur within a more confined region and this avoids substantial degradation of underlying layers. The time length of the pulse is so short that substantially the entire pulse (the entire energy of the pulse) is able to enter the material before the material can respond to it and substantial ablation occurs. Therefore, over the timescale of the pulse length there is little time for thermal conduction, so that the laser process occurs within the thermal confinement regime. As a result there is a much smaller heat-affected zone since the ablation occurs before much heat conduction can occur. Therefore, the edge quality is usually much better than for longer-pulse laser, as little or no melting occurs of the metallic layer.

To illustrate this, the thermal diffusion length in bulk gold over 30 ns (typical excimer pulse length) is 3.9 μM, whereas for a 10 ps ultra fast laser pulse, the thermal diffusion length is only 67 nm. This thermal confinement means that lower fluences can be used to ablate the metal when using a ps laser compared to a ns laser, resulting in less substrate damage in both a vertical and a lateral direction. Furthermore, since the laser is able to completely enter the top layer of material before the ablation of the material occurs, there is little or no absorption of the laser in the underlying layers of the device.

This demonstrates that a pico-second laser ablation process may be used, for example to underlying contacts of devices, in a process of 'chipping' away at a metallic layer to a high resolution and/or in conjunction with a nano-second laser ablation method in order to refine pattern features of a device.

In embodiments, the substrate comprises at least one organic layer in between upper and lower conductive layers. The optical density of this organic layer may be low or high, but when an ultra fast laser pulse (high intensity) is incident upon the layer there is considerable absorption regardless of the (low intensity) absorption coefficient of the organic layer, since multi-photon processes become significant. Thus under an ultra fast laser pulse nearly all materials are highly absorbing. The laser pulse is used to 'chip' away at the upper conductive layer. When this upper layer is fully removed, the next laser pulse removes only a thin layer (typically ≤10 nm) of the organic layer, since the absorption is so localised by the multi-photon processes and the short pulse length. Thus no significant damage occurs to the underlying organic (dielectric or semiconducting) layer. After the conductive layer is fully removed by a number of pulses, laser irradiation is stopped.

Preferably, the organic layer also has a low thermal conductivity, in order to minimize diffusion of heat to any heat-sensitive lower layer. Preferably, the heat conductivity of the organic layer and/or underlying substrate is less than $1 \cdot 10^{-2}$ W/cm·K (1 W/m·k).

As previously mentioned both a nano-second ablation process and a pico-second ablation process may be used in conjunction with one another in order to pattern both coarse and fine features of a device. This provides a low temperature patterning method that results in high conductivity connections, high resolution and a high throughput process.

Example 1

Achieving Coarse Selective Patterning of Upper Metal Layers of an Electronic Device Comprising a Stack of Underlying Organic Semiconductor and Dielectric Layers A method is disclosed of patterning an upper conductive layer of a structure for an electronic device, such as TFT structure. The structure includes at least one organic dielectric layer that is beneath the upper conducting layer. The upper conductive layer is ablated using a pulsed laser to remove regions of the upper conductive layer from the dielectric layer. The process of laser ablation uses a single pulse of the laser that substantially completely removes a region of the upper conductive layer to expose the dielectric layer beneath.

FIG. 1 illustrates fabrication of a multi-layer stack for an organic TFT. Conductive material is deposited and patterned on a substrate 1 to form source and drain electrodes 2. The substrate may be either glass or a polymer film, but preferably a plastic substrate such as polyethyleneterephtalate (PET) or polyethylenenaphtalene (PEN) is used. The patterned conductive layer 2 comprises a conducting polymer, such as PEDOT, or a metallic material, such as gold, copper or silver. It may be deposited and patterned through solution processing techniques such as, but not limited to, spin, dip, blade, bar, slot-die, or spray coating, inkjet, gravure, offset or screen printing. Alternatively, vacuum deposition such as evaporation, or sputtering followed by photolithographic patterning or other subtractive patterning techniques, such as laser ablation may be used.

Once the conductive layer has been patterned to form the source and drain electrodes, a layer of semiconducting material 3 may then be deposited over the substrate and patterned electrodes. The semiconducting layer may comprise materials such as, but not limited to, a polymer semiconductor material, such as a polyfluorene, polythiophene or polyarylamine or a small molecule-organic semiconductor such as pentacene. A broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), offset printing, blade coating or dip coating, curtain coating, meniscus coating, spray coating, or extrusion coating. Alternatively, the semiconducting layer may be deposited as a thin continuous film and patterned subtractively by techniques such as photolithography (see for example WO 99/10939) or laser ablation.

A layer of gate dielectric material 4 is then deposited onto the layered substrate. Materials such as polyisobutylene or polyvinylphenol may be used as the dielectric material, but preferably polymethylmethacrylate (PMMA) and polystyrene are used. The dielectric material may be deposited in the form of a continuous layer, by techniques such as, but not limited to, spray or blade coating. However, preferably, the technique of spray coating is used. Optionally more than one dielectric layer may be deposited to form a dielectric stack, as described further later.

The deposition of the dielectric layer is then followed by the deposition of a gate electrode 5 and interconnect lines. The gate electrode may comprise a thin film of inorganic metal such as gold or a cheaper metal such as copper, of a thickness suitable for the desired conductivity. The gate electrode may be deposited using techniques such as sputtering or evaporation techniques or solution processing techniques such as spin, dip, blade, bar, slot-die, gravure, offset or screen printing. The selective ablation process described below is more easily achieved for thin layers of metal than for thick layers. However, in many cases a minimum layer thickness is required in order to reach the necessary conductance. For a gold layer a thickness of 50 nm provides a useful conductance for a range of applications, including gate interconnections for flat panel displays.

The metallic layer 7 is preferably ablated using a 248 nm pulsed excimer laser 6, such as the Lumonics PM800 laser (300 mJ, 30 W), although other lasers and wavelengths can also be used. The upper layer of the preferred gold material is removed upon firing a single shot from the laser, without any damage to the underlying metallic layers or the dielectric layer and, in addition, very little debris is formed. The process window is large when only a single shot is fired. For example a range of fluence from 28 to 112 mJ cm$^{-2}$ may be used to remove the upper gold layer without any apparent damage to the underlying layers. This results in a clean process without the formation of excess debris. This range of fluence is related to the absorption coefficient, thickness and adhesion of the upper metal layers.

Figure 2A:
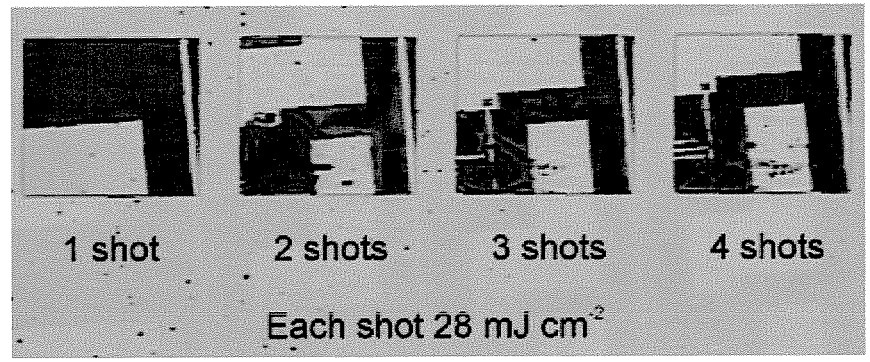
FIGS. 2a to 2c illustrate removal of gold from an upper layer of a device with a single shot of an excimer laser at a fluence of 28 mJ cm$^{-2}$, 55 mJ cm$^{-2}$ and 112 mJ cm$^{-2}$ respectively.
Figure 2B:
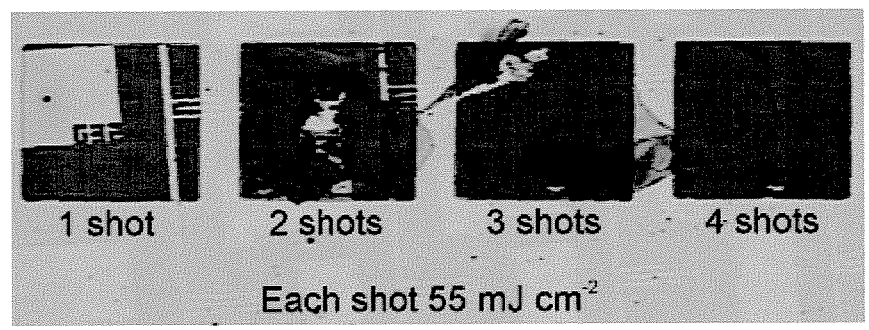
Figure 2C:
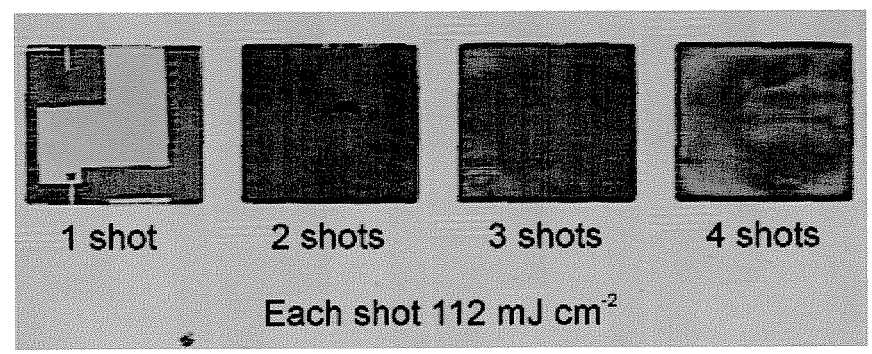

FIGS. 2a to 2c illustrate removal of an upper layer of deposited gold material of an electronic device by ablation at fluences of 28 mJ cm$^{-2}$, 55 mJ cm$^{-2}$ and 112 mJ cm$^{-2}$ respectively, each for (left to right) 1, 2, 3 and 4 laser shots. In these figures the light areas correspond to the upper gold layer. For multiple shot exposure significant degradation and poor patterning is observed leading, in some cases, to complete removal of the metallic layer from the substrate. However, as long as only a single shot is fired, clean patterning of the metallic layer is observed over a broad range of fluences.

Figure 3A:
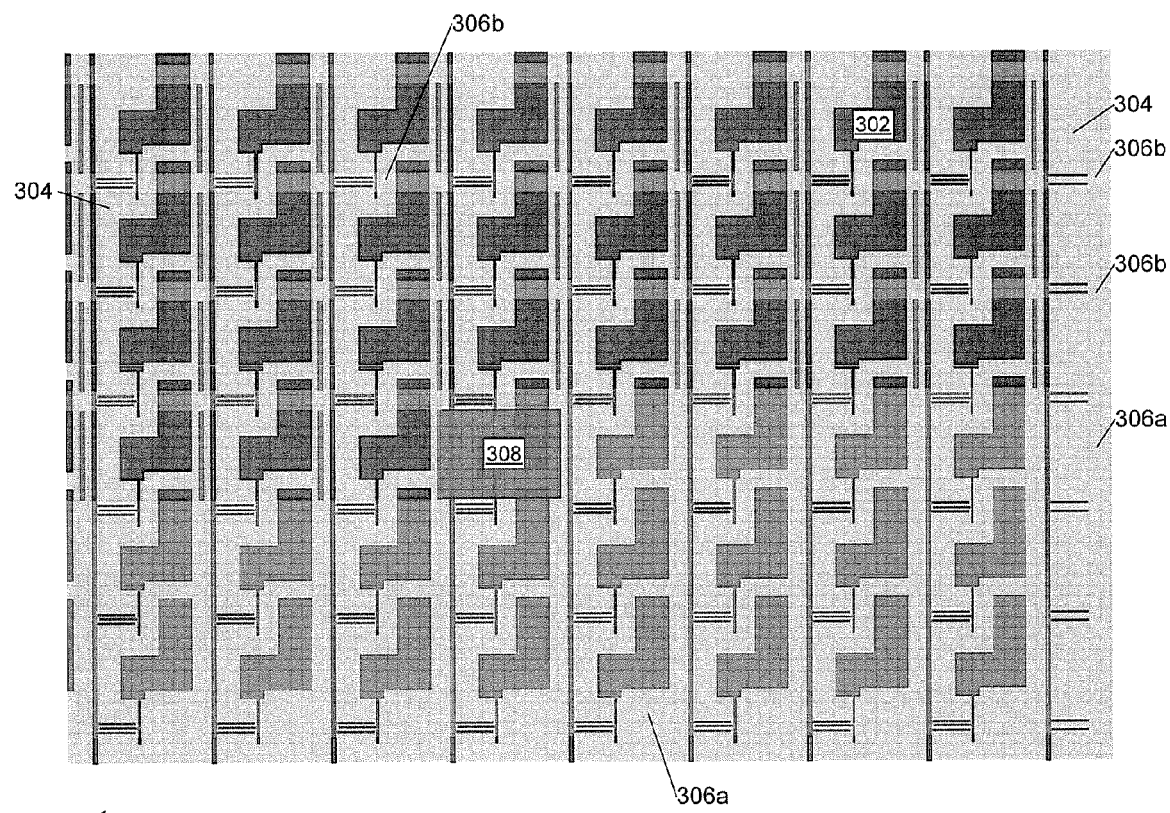
FIGS. 3a and 3b illustrate, respectively, removal of material from an upper gold layer of a device using a nanosecond pulsed laser, and burring after laser ablation of an upper gold layers using a nanosecond pulsed laser.

This process may be used to image (pattern) an entire active matrix panel. FIG. 3a shows a schematic diagram of part of an active matrix TFT backplane for a display under fabrication by a step-and-repeat laser ablation process as described above, depicting a process of removal of material from the upper gold layer of such a device.

Referring to FIG. 3a, in more detail this shows a PET substrate 300 bearing a lower gold layer 302 with a dielectric stack 304 deposited over the underlying active layers of the device. An upper deposited gold layer is present, uniform 306a before ablation, and in striped regions 306b after ablation. In this example a rectangular laser spot 308 is used, with dimensions 508 µm×394 µm. The rectangular homogenised pulsed laser is moved across the surface of the layered substrate in a step-and-repeat fashion to remove regions of the upper gold layer, which here results in a gate width (region 306b) after ablation of approximately 106 µm.

Figure 3B:
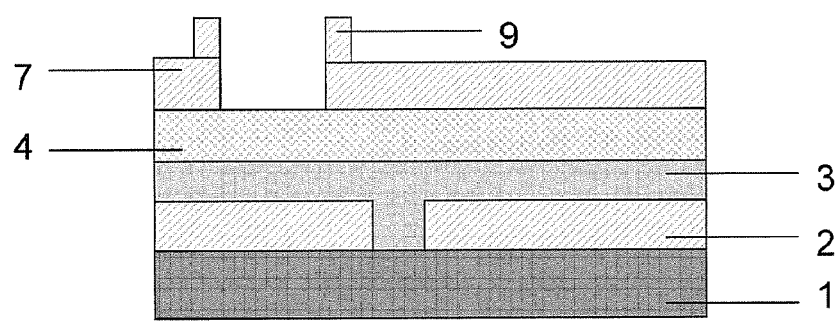

Sometimes, at the boundary of the imaged step-and-repeat regions, a large area of burring may be seen where the molten gold has resolidified forming a significant bump; a loose edge of gold may also be detected. The burred edges can project through the overlying layers by up to 500 nm unless there is further processing (which may take place, for example, after the formation of the lower source and drain contacts within a top gate configuration TFT). FIG. 3b schematically illustrates the effects of burring 9 after ablation of the upper gold layers using a nanosecond laser beam pulse. However, the effect of burred edges is not a problem when patterning contacts on an upper conductive layer such as the gate level for a top gate structure, or for the source and drain contacts on a bottom level device providing the subsequent deposited dielectric layer is many microns thick. As previously mentioned, where further processing is desirable in ultra-short pulse technique may be employed.

In the above example, good conductivity for the gate line is maintained after the laser ablation process. However, if desired higher conductivities may be produced by increasing the gold thickness (or width), for example to around 100 nm, while still obtaining good ablation results and good isolation. The process described above can also maintain an extremely high throughput for the process (up to 300 parts per second for a single shot per part process).

Without wanting to be bound by theory, it is thought that one possible explanation for the fact that the upper layer ablation process is self-limiting for one shot of the nanosecond laser beam is that the lower conductive layer may be better-adhered to the substrate than the upper conductive layer (gold layer). In this case, the ablation threshold of the upper layer is therefore below that of the lower layer. In addition, prior to the ablation of the upper layer the material of the upper layer is highly absorbing at 248 nm and absorbs greater than 90%, typically in the region of 99% of the incident radiation. The lower layers of the device will therefore be protected while all upper layer of the device is present. In this sense, the laser ablation technique described above is self-limiting as the majority of the radiation energy of a single shot is absorbed in and ablates the upper layer of the device. Therefore, upon ablation and removal of the upper gold layer, little or no beam energy remains to be absorbed by the underlying layers and substantial ablation of the underlying layers does not occur.

If this technique of nanosecond laser ablation were conducted on the lower layers of a device, for example to pattern the source and drain contacts, the lower level conductive layers would ablate well before the laser beam had finished penetrating the layer. Therefore, this technique is also suitable for the lower source and drain level of a top gate configuration as well as for the upper gate level.

In addition, when ablating an upper layer of the device, a significant degree of protection of the lower layer from the remaining laser beam energy is thought to come from the plasma and debris formation that is formed above the upper layer by the ablation process. By contrast this plasma and debris may be thought to be a disadvantage in other, conventional applications (for instance, so-called plasma-shielding) as it has the effect of limiting the etch rate, for example when deep (mm) trenches are drilled into solids. In embodiments of the present invention, when the remaining laser beam energy comes into contact with the formed plasma, much of the laser is reflected by the plasma formation or scattered and/or absorbed by the plume of debris particles, therefore shielding the layered substrate from the remaining part of the laser beam energy. Therefore, after the highly absorbing conductive layer has been ablated the resulting plasma formation substantially prevents further laser beam penetration and the underlying layers of the device are therefore protected. Higher fluence processes produce increased plasma formation and therefore more shielding from the remaining radiation.

Some extra protection of the lower level of gold, and of the semiconducting layer is also afforded by the dielectric stack, as this absorbs to some extent at 248 nm and therefore further attenuates any residual laser radiation that impinges on the dielectric. Typically for a 1 micron stack of suitable dielectrics, an optical density of approximately 0.15 is provided by the entire dielectric stack, thus absorbing in the region of 30% of the residual radiation.

An example of a dielectric stack that may be employed in embodiments of the method is: an underlying layer, for example 200 nm of polystyrene (PS); a middle layer, for example 500 nm of parylene; and a top layer, for example 10 nm of PVP. In this example the top layer is an optimal adhesive layer. In other embodiments, therefore, the dielectric stack may comprise only two layers.

The above described methods may be used to replace current technology to define gate electrodes for making displays, and to provide high resolution, high throughput, more reliable and potentially (optically) distortion-correctable processes.

Figure 4A:
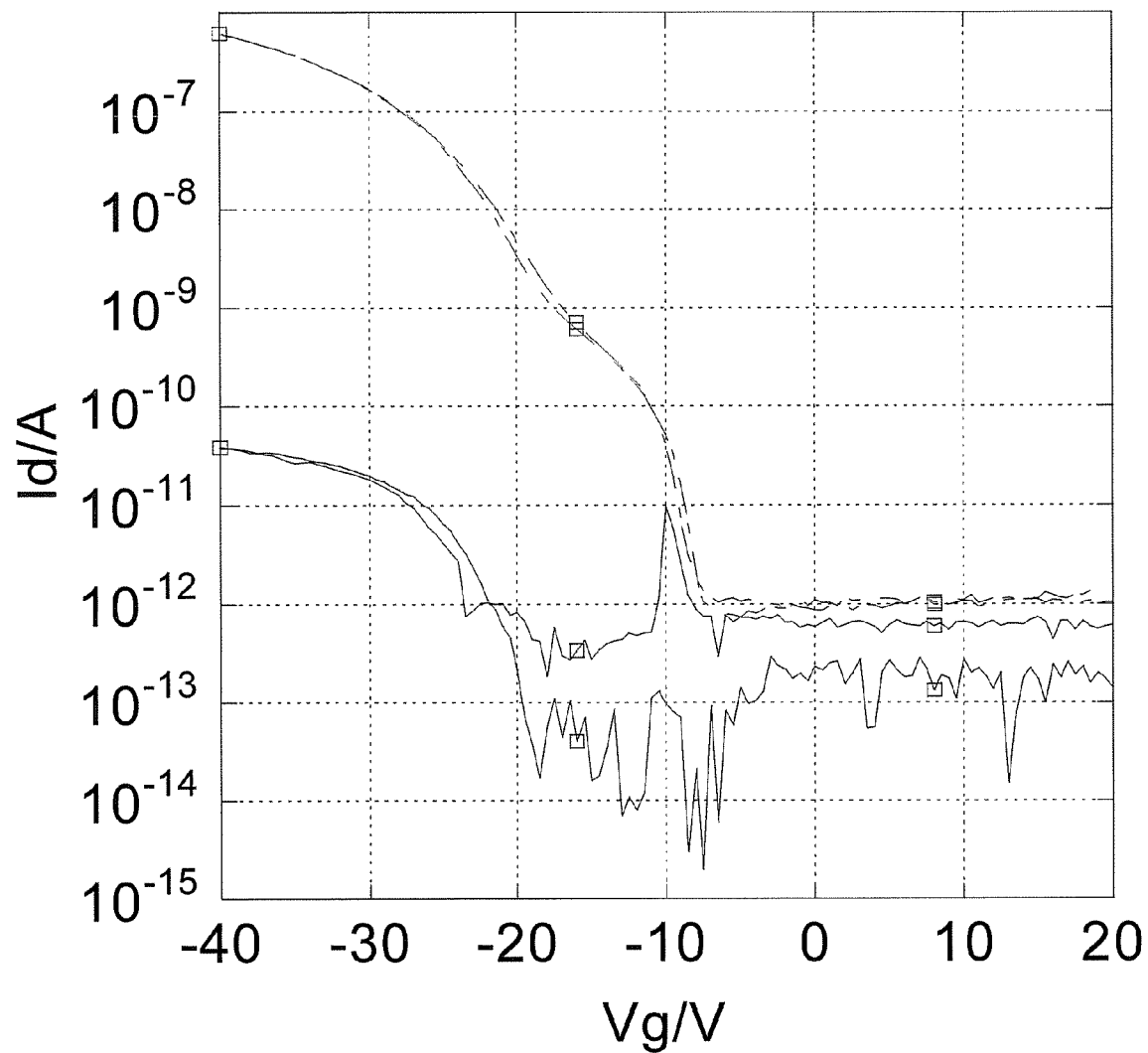
FIGS. 4a and 4b show, respectively, an example I-V characteristic curve of a TFT, and an active matrix backplane, both fabricated according to a first embodiment of the present invention.

FIG. 4a shows an example of an I-V characteristic curve of a TFT fabricated as described above, with a 50 nm gold laser patterned gate (Excimer 248 nm, 30 ns pulse). No deterioration of the 'on' and 'off' current was observed compared with a device in which the gate electrode was patterned by inkjet printing of a metal ink.

Embodiments of the method allow the fabrication of a thin film field effect transistor (FET) which has a ratio of off resistance to on resistance of greater than $10^5$ or $10^6$. These results show that the channel of the transistor is substantially undamaged by the ablation. In one example such results were achieved with an ablated metal (copper) thickness of 50 nm, ablated at 80 mJ/cm$^2$ in a single shot. Preferably the ablated metal thickness is less than 500 nm, 400 nm, 300 nm or 200 nm. The off-on ratio may be determined by measuring as the ratio of source/drain (S/D) current: Vds may be fixed at, say, −40V and the S/D current measured for Vgs=−40V and Vgs=+20V. Alternatively lower voltages may be employed for measuring this resistance ratio, for example measuring at Vds=−15 volts or even down to Vds=−1 volt, for Vgs=−40V and +20V. This resistance ratio may be measured, for example, before connecting to a display medium or incorporation into a display device.

Figure 4B:
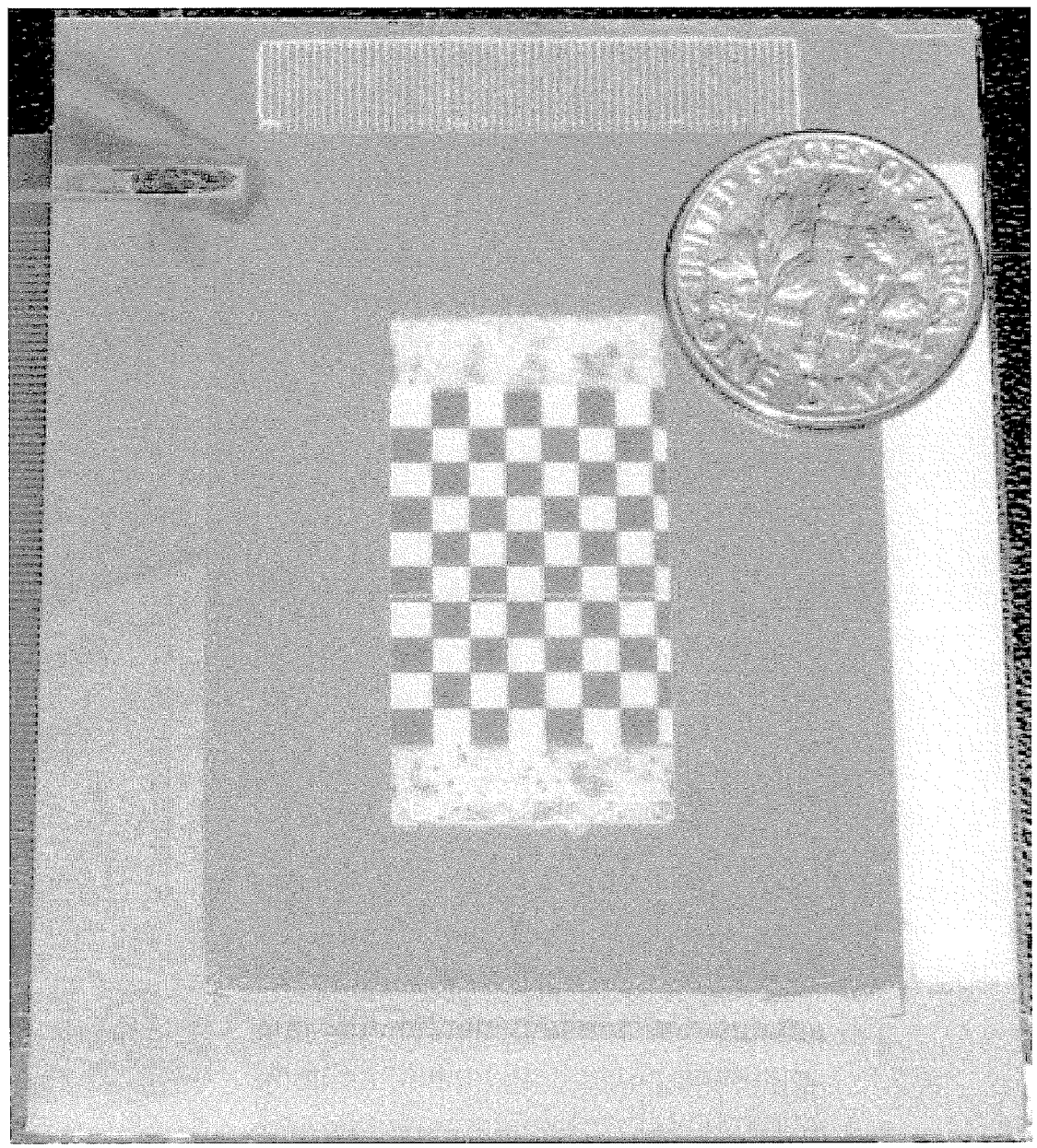

FIG. 4b shows a 60×80 100 ppi (pixels per inch) active matrix backplane fabricated as described above, driving a display medium. All 60 gate lines were formed by the laser ablation process and are functioning, and a good display contrast is seen, showing that the TFTs have good 'on' and 'off' currents.

In an extension to the process described above, a step-and-repeat method may be used in order to provide nanosecond laser ablation of a thick metallic layer, which otherwise could not easily be ablated in a single ablation step. With this extended process a metallic layer, say in the region of 50 nm thick, may be deposited and patterned using a nanosecond pulsed laser beam by the methods described above. A further metallic layer may then be deposited over the top of this initial patterned metallic layer, and then patterned again using the nanosecond laser ablation process. This process may then be repeated until a metallic layer of the desired thickness is achieved.

Figure 10:
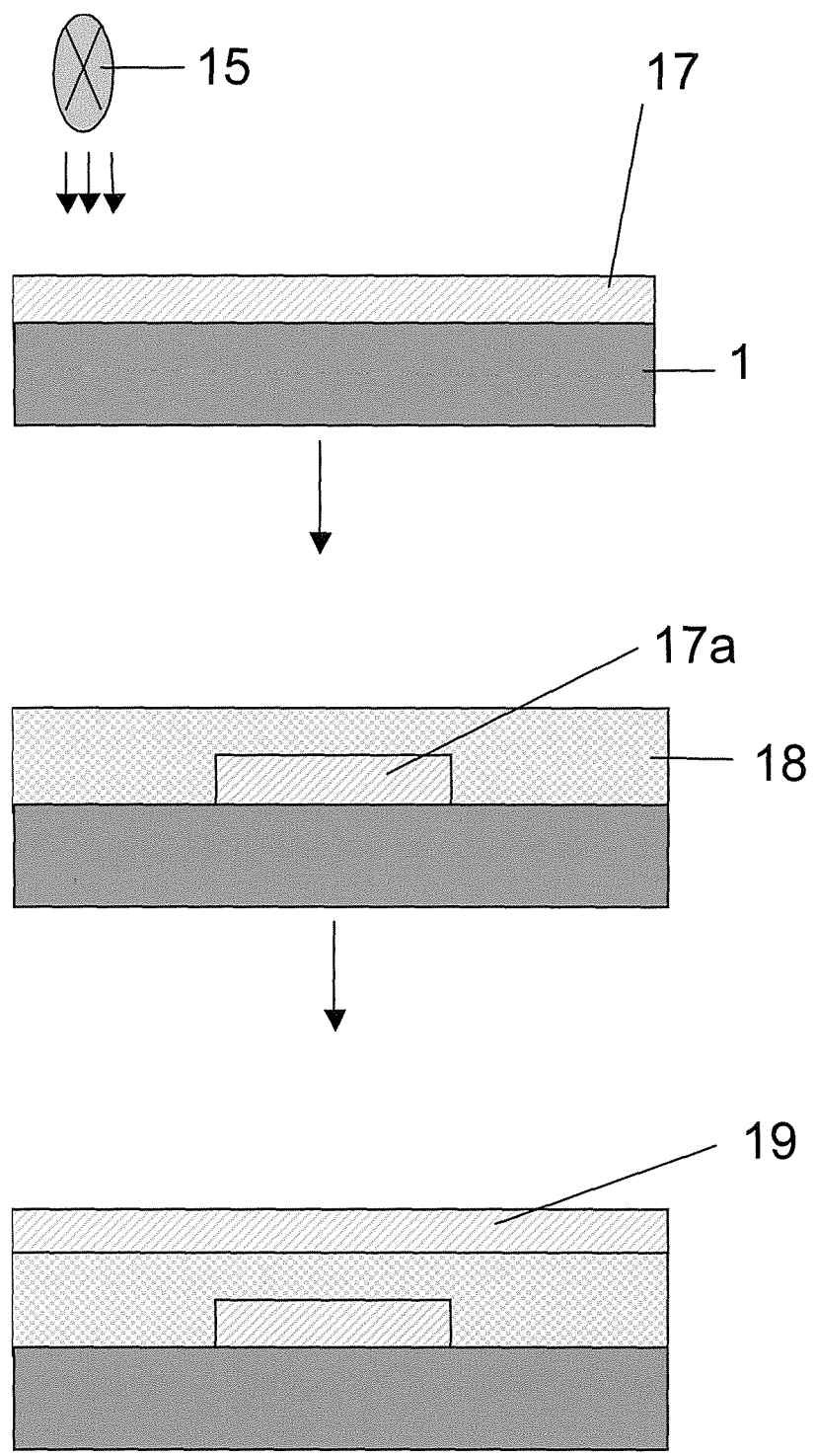
FIG. 10 illustrates patterning of a gate electrode for a bottom gate configuration thin film transistor (TFT) using an ultra-short pulse laser ablation technique.
Figure 11:
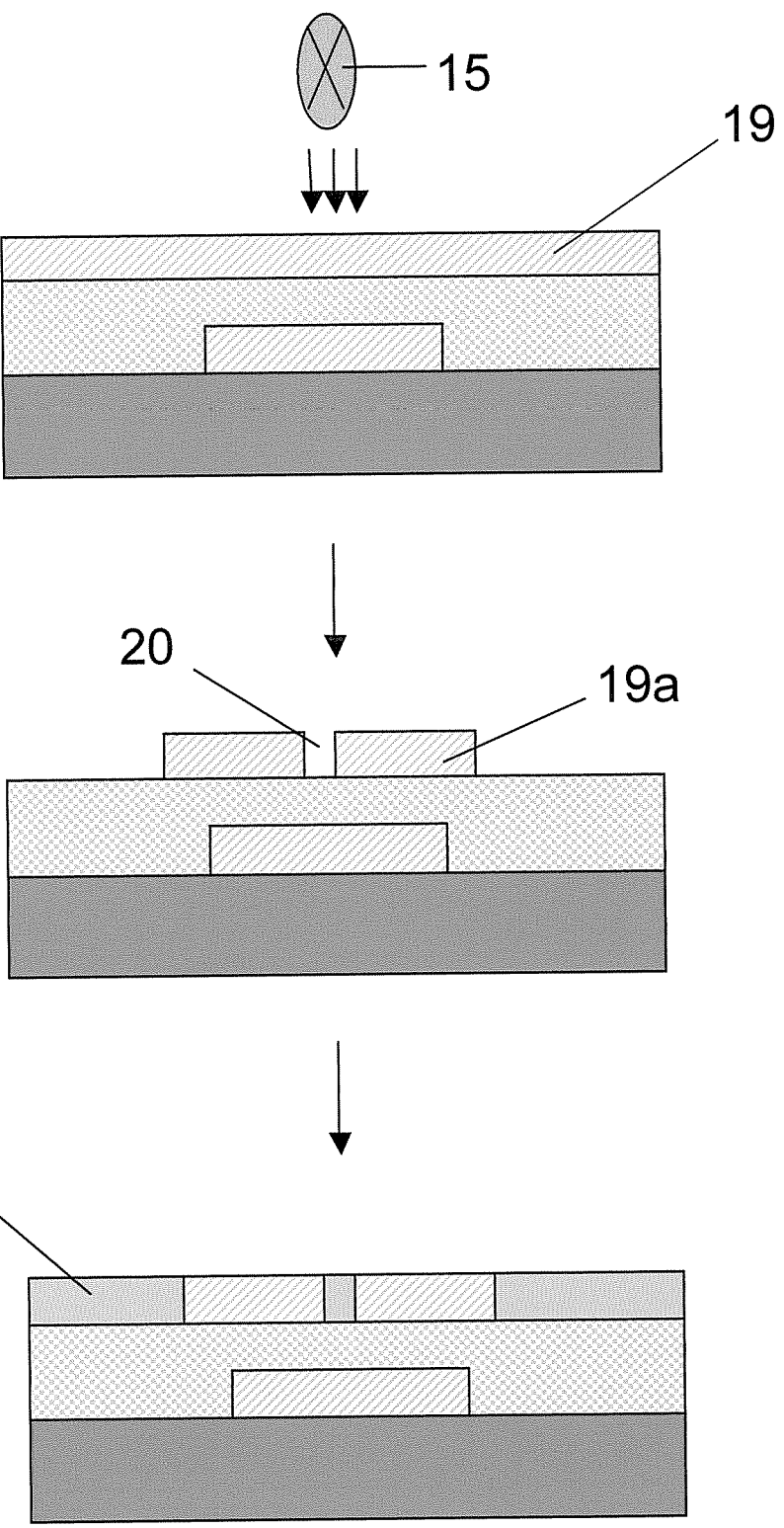
FIG. 11 shows patterning of source and drain electrodes in a bottom gate configuration thin film transistor (TFT) using an ultra-short pulse laser ablation technique.

The above-described method for patterning an upper conductive layer on top of an organic dielectric layer is also applicable to other than top-gate device configurations such as bottom-gate, bottom-contact TFT configurations, as shown substantially in FIGS. 10 and 11, in which the active semiconducting layer is deposited after ablative patterning of the source-drain electrodes on the surface of the gate dielectric layer. The method may also be used to fabricate devices such as diodes, as well as passive devices and instruments.

Example 2

Achieving Fine Structure Selective Patterning of Lower Layers of an Electronic Device Described below is an example of a method of producing a device using multiple shots of low energy ultra short laser pulses for the fabrication of fine features within a thin film transistor (TFT) structure. This process allows for controlled patterning and fine tuning with very high selectivity. This technique may be used to remove small area thin portions of small areas of a layer of material.

This process is particularly advantageous for removing material through a 'chipping' process on a lower layer of a device. Alternatively, the process may be used for defining features when used in combination with longer wavelength lasers that have previously been used to ablate large areas of an upper layer of a device. In this way, the pico-second ablation process may be used without destroying underlying layers allowing controlled patterning with very high selectivity.

Figure 5:
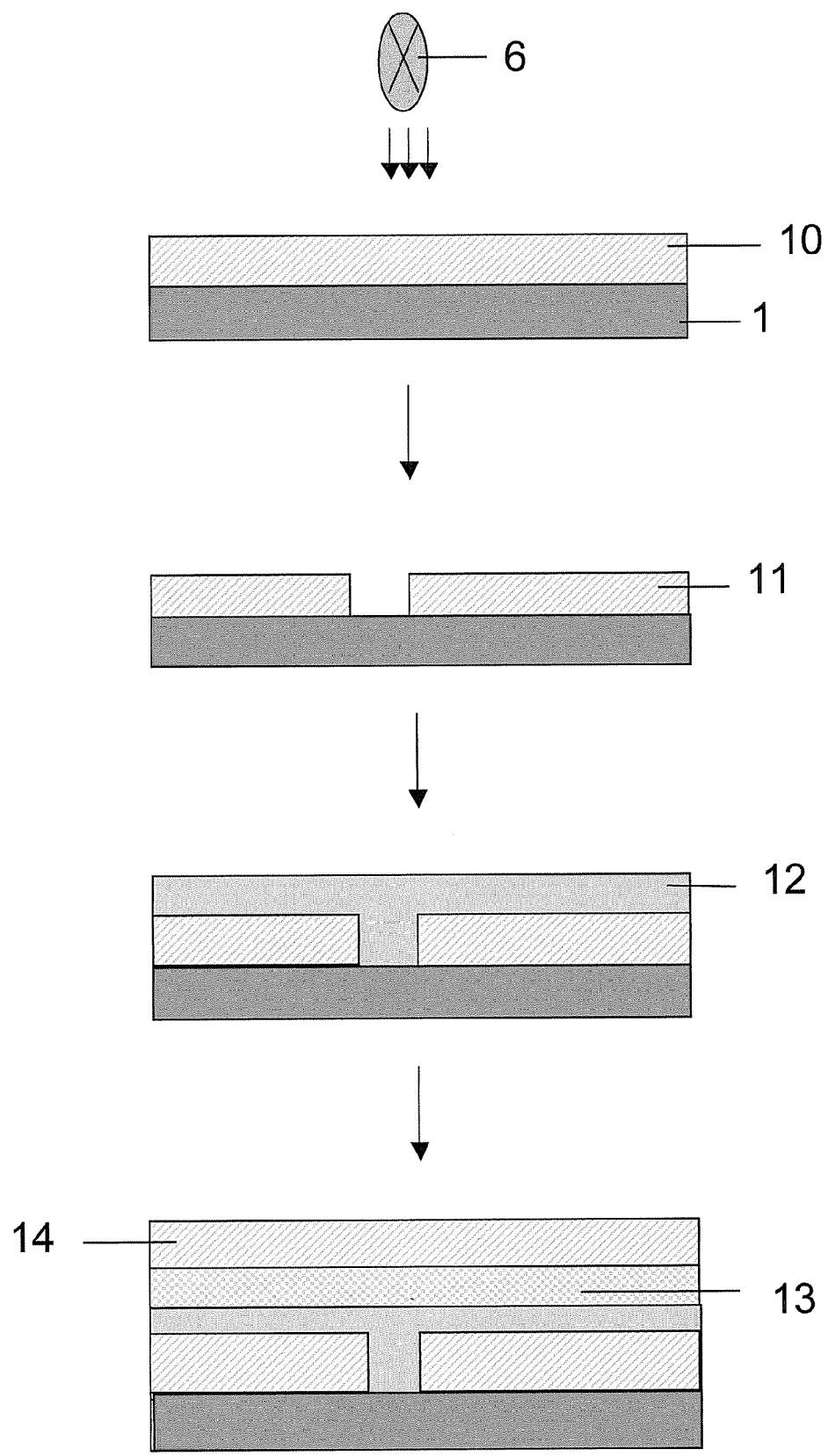
FIG. 5 illustrates a method of forming a thin film transistor device according to a second embodiment of the present invention.

Referring to FIG. 5, a substrate 1 is coated with a layer of conductive material 10. The substrate may be either glass or a polymer film, but preferably PET substrates are used with a thickness of ~200 μm. An initial conductive material preferably a metallic layer 10, is then deposited onto the substrate through methods such as sputtering or evaporation techniques or solution processing techniques such as spin, dip, blade, bar, slot-die, or spray coating, inkjet, gravure, offset or screen printing. The metallic material may be any metal that adheres well to the substrate surface, but is preferably a layer of gold. The gold layer is preferably deposited at a thickness ranging from 10 nm to 70 nm. Alternatively, the metallic layer may be a bilayer structure that includes a seed layer between the metallic layer and the substrate to improve adhesion. A preferred such seed layer comprises copper with gold grown on top. Alternatively gold may be used as the seed layer, which may then be patterned and then more gold grown on top. Still further, alternatively, nickel may be used for a seed layer.

The metallic material may then be patterned in order to form the source and drain electrodes 11 of the device, preferably by a laser ablation technique although other techniques such as optical lithography or wet etching may also be used.

Preferably, laser ablation using a ultra-short pulse laser is used in order to achieve well defined edges and accurate dimensions. In the case of metallic material ablation, radiation from a pulsed excimer laser beam 6 may be used (for example a 248 nm KF laser). In the areas of the metallic layer that are subjected to the laser beams, the metallic material is capable of being ablated at the above wavelength, resulting in the exposure of the substrate surface to produce a channel area of the device, as is shown in FIG. 5. The ultra-short laser beam technique may be used for the patterning of the source and drain electrodes by steadily 'chipping' away at the conductive material in order to allow more controlled material removal. This technique is particularly suited to defining a pattern in a lower conductive layer, that is a layer over which further layers are present in a working device. Thus source and drain electrodes may be defined by laser ablation without edge damage or burring which would deteriorate the electrical contact between the electrode and the overlying semiconducting layer.

The above technique of ultra-short-pulse laser ablation may also be used in conjunction with a coarse nanosecond laser ablation technique. The later may be used in a first step to coarsely define the source-drain structure, and then the ultra-short laser ablation may be used for fine patterning and removal of any edge damage or burring.

Continuing to refer to FIG. 5, semiconductor layer 12 is then deposited on top of the patterned metallic layer, covering both the ablated regions and the remaining conductive material. The semiconductor material may be an polymer semiconductor material, such as polyfluorene, polythiophene or polyarylamine or a small molecule-organic semiconductor such as pentacene. The material may be deposited from solution by standard thin film coating techniques, including but not limited to spin, dip, blade, bar, slot-die, or spray coating, inkjet, gravure, offset or screen printing or from vacuum phase. However, the semiconductor is preferably deposited by the technique of spray coating. In embodiments the solution concentration and spin conditions were chosen so as to produce a dry solid film of semiconductor, preferably of a thickness in the region of ~50 nm.

A dielectric layer 13 or a sequence of dielectric layers may then be deposited from solution in the form of a continuous layer onto the active semiconductor layer of the device. Techniques may be used, such as, standard thin film coating techniques, including but not limited to spin, dip, blade, bar, slot-die, or spray coating, inkjet, gravure, offset or screen printing. However, preferably, the technique of spray coating is used with a solvent or mixture of solvents selected (for example by experiment according to the materials employed) to minimise dissolution or swelling of the semiconducting layer. Alternatively, the dielectric material may be deposited using vapour phase deposition techniques such as evaporation or chemical vapour deposition.

The dielectric material is preferably deposited in such a way so that no substantially degradation occurs to the underlying layers, as is disclosed in our previous patent application number WO01/47043 (hereby incorporated by reference in its entirety). This document describes a method for forming a transistor by depositing a first material from solution in a first solvent to form a first layer of the transistor and subsequently, whilst the first material remains soluble in the first solvent, forming a second layer of the transistor by depositing over the first material a second material from solution in a second solvent in which the first material is substantially insoluble.

Suitable solution process able dielectric materials that may be used are polystyrene dissolved in xylem, polymethylmethacrylate (PMMA) or polyisobutylene (PIB). Parylene is an example of a dielectric material that can be deposited via chemical vapour phase deposition.

The semiconductor layer/dielectric layer interface impacts the device performance and a double dielectric configuration may be used. A dielectric with a low dielectric constant (k) in contact with the semiconducting layer increases the mobility in the TFT and reduces hysteresis. A second, higher-k dielectric layer deposited on top may then be to increase the capacitance of the gate dielectric for a given thickness of the dielectric stack. In order to achieve good adhesion or wetting of the upper gate electrode an adhesion-promoting, or wetting layer, for example comprising PVP, can also be deposited on top of the dielectric layer stack, although this is not necessary.

Figure 6:
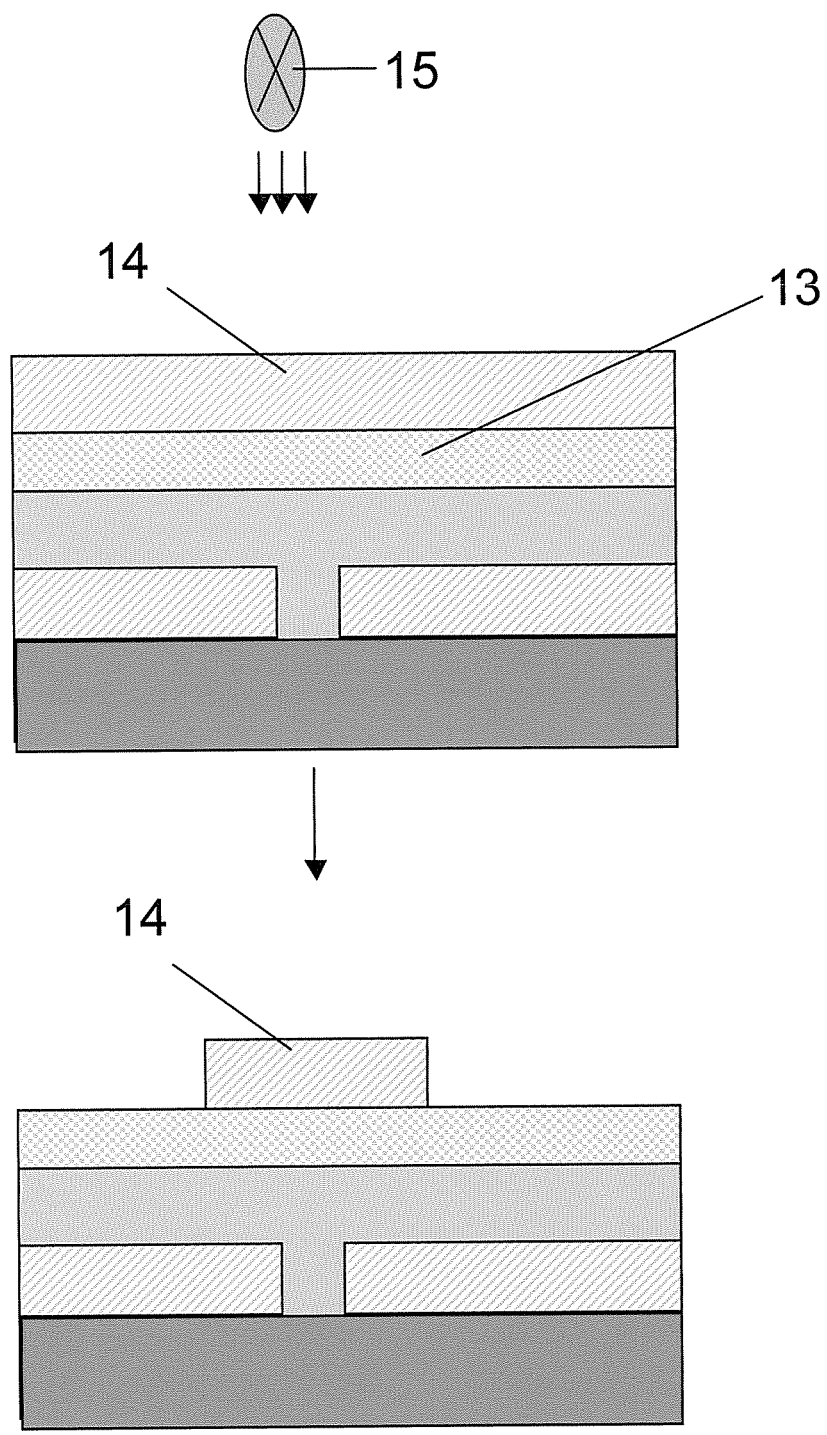
FIG. 6 shows a method of producing a device using an ultra-short pulse laser for the fabrication of a gate electrode of a thin film transistor.

Referring now to FIG. 6, the deposition of the dielectric layer is followed by the deposition of a gate electrode 14 and interconnect material as a continuous or coarsely pre-patterned films. The gate electrode may be a conductive polymer, such as polyethylenedioxythiophene doped with polystyrene sulfonic acid (PEDOT/PSS), but preferably, a metallic material such as printable inorganic nano-particles of silver, aluminum, copper or chrome is deposited. Most preferably a layer of copper or gold is used. The gate electrode may be deposited using techniques such as sputtering or evaporation techniques or solution processing techniques such as spin, dip, blade, bar, slot-die, gravure, offset or screen printing from a nano-particle dispersion or from a chemical precursor.

An ultra-short pulse laser beam is may then be used to irradiate the portions of the gate metal layer that need to be removed to define the gate electrode and interconnects. For example, a frequency tripled, YAG-pumped ultra-fast laser is used to scan over the surface. A Lumera Laser GmbH Staccato laser may be employed; this laser has a pulse length of <15 ps, a spot size of about 80 µm and a wavelength of 355 nm. However, any sub-1 ns short-pulse length laser with a similar average power capability (see below) may be used. Preferably, the pulse length of the laser is less than 100 ps, more preferably less than 10 ps.

A thin conductive layer may be removed with a single ultra-short laser pulse but in the case of a thicker film multiple ultra-short laser pulses may be needed to remove substantially all conductive material from the substrate. However, in this latter case careful selection (by experiment) of the number of pulses is desirable in order to avoid exposing the substrate to the laser when the upper conductive layer is so thin that the underlying layers are insufficiently shielded from the laser radiation remove significant portions of the underlying dielectric layer.

Preferably the laser beam is raster scanned over the surface of the substrate in order to image a region of the gate conductive layer. In the exposed regions the gate metal is removed from the substrate by ablation. The remaining metallic material forms the gate electrode of the device. If damage should occur to the underlying dielectric layer little or no degradation to the TFT performance will result, as only the material of the dielectric layer directly underneath the gate electrode will be damaged due to the narrow heat diffusion range of a pico-second laser process.

Without wanting to be bound by theory, after the pulse has completely entered the material to be ablated ablation is thought to occur due to stress confinement effects, caused by the high rate at which the energy enters the material (high energy absorption rate).

In contrast to longer pulse lasers, substantially the entire pulse is absorbed before the metal layer can be ablated. In this way very little laser radiation penetrates deep into the material, therefore protecting the underlying layers that would otherwise degrade or ablate upon irradiation. If the material of the conductive layer ablated before the laser pulse had fully entered the sample there would be far more potential for damage to the underlying device layers.

The absorption of the layered device stack at a wavelength of 266 nm is such that over 90% of the radiation is transmitted through to the lower metallic source and drain level of the device when the upper gold layer is not present. Therefore little protection of the underlying layers is afforded by the layered stack. However these underlying layers are protected by the presence of the upper conductive layer to be ablated. For example gold has a transmission of about 3% at a thickness of 50 nm.

The above ultra-short-pulse laser ablation technique can also be used in conjunction with a coarse nanosecond laser ablation technique, which is used in a first step to coarsely define the rate structure. The ultra-short laser ablation may then be used for fine patterning and removal of any edge damage or burring. The nanosecond coarse-patterning laser ablation is preferably performed with a single pulse, as discussed above, in order to avoid damage and removal of significant portions of underlying layers.

Figure 7:
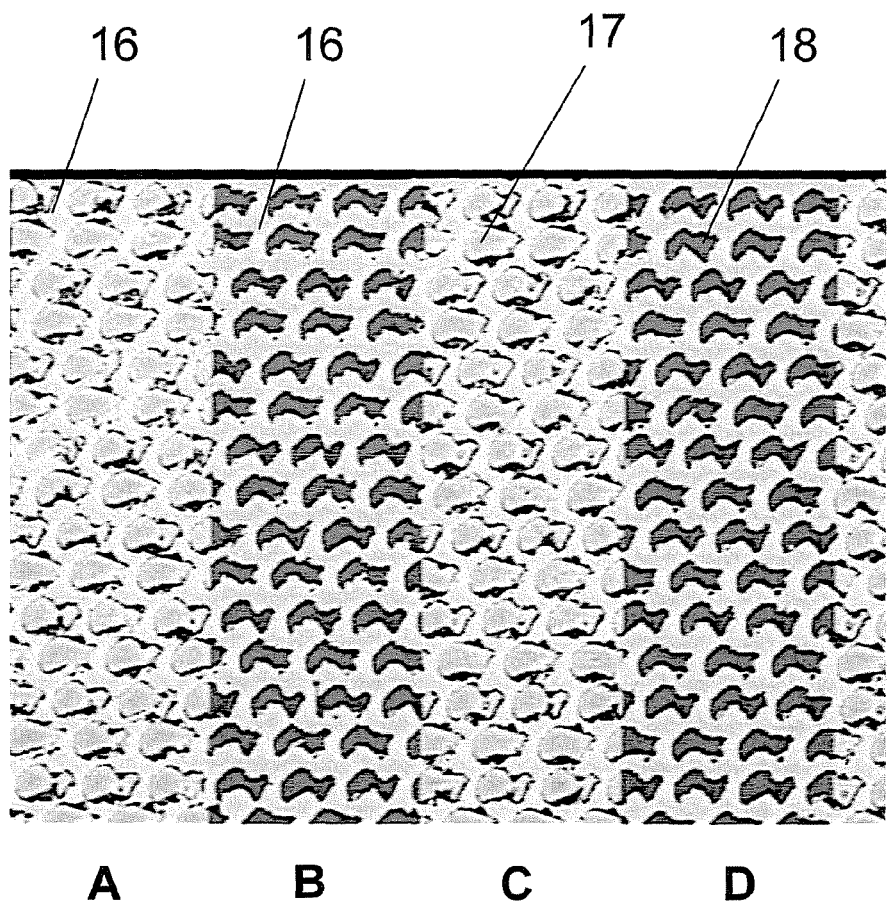
FIG. 7 shows an example of a sample ablated by an array of individual shots from a pico-second pulse laser ablating material of an upper layer of a device and revealing an undamaged underlying metallic layer.

FIG. 7 shows an example of a sample ablated by an array of individual pico-second shots from a (spatially non-uniform) laser beam, ablating material of an upper layer of a device and revealing an undamaged underlying metallic layer. In FIG. 7, reference numeral 16 indicates an upper gold layer 16 of the device and reference numeral 17 indicates an underlying gold layer; these are separated by a dielectric stack. Regions A and C of FIG. 7 show ablation of the upper gold layer 16 without any damage being caused to the underlying gold layer 17. Regions B and D of FIG. 7 show areas of the device where no underlying gold layer is present. In this example the upper gold layer has a thickness of 50 nm, and the underlying gold layer 17 can be seen to remain undamaged by the process.

Figure 8:
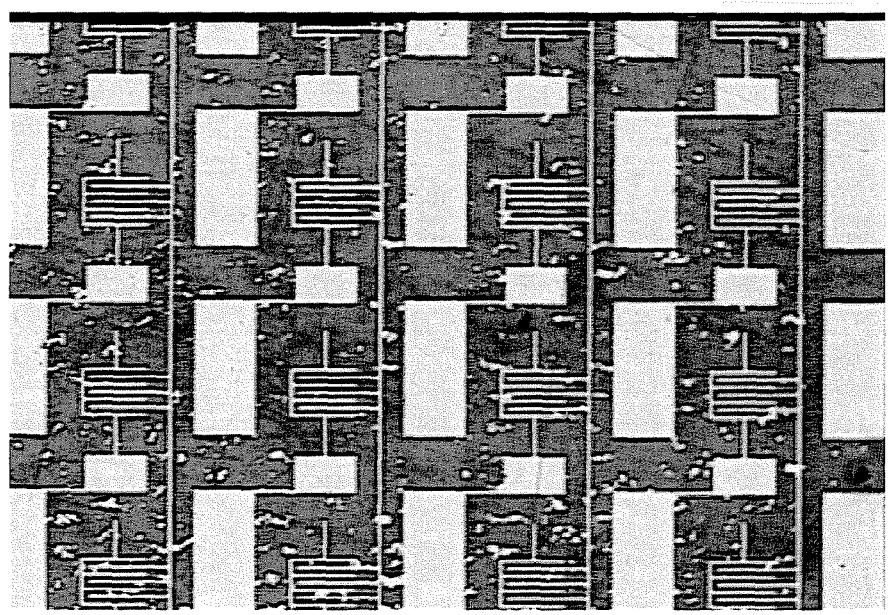
FIG. 8 shows a view from above of an example of a portion of an active matrix display structure patterned using an embodiment of the present invention.

FIG. 8 shows a view from above of a portion of an example active matrix display structure patterned as described above (with a more spatially uniform laser beam). The structure of FIG. 8 has afterwards been further treated by very gentle mechanical rubbing of the upper layer in order to remove remnants of metallic material (in FIG. 8 the light coloured regions show upper layer metal). It can again be seen that the underlying metallic layer remains substantially undamaged by the process.

Figure 9:
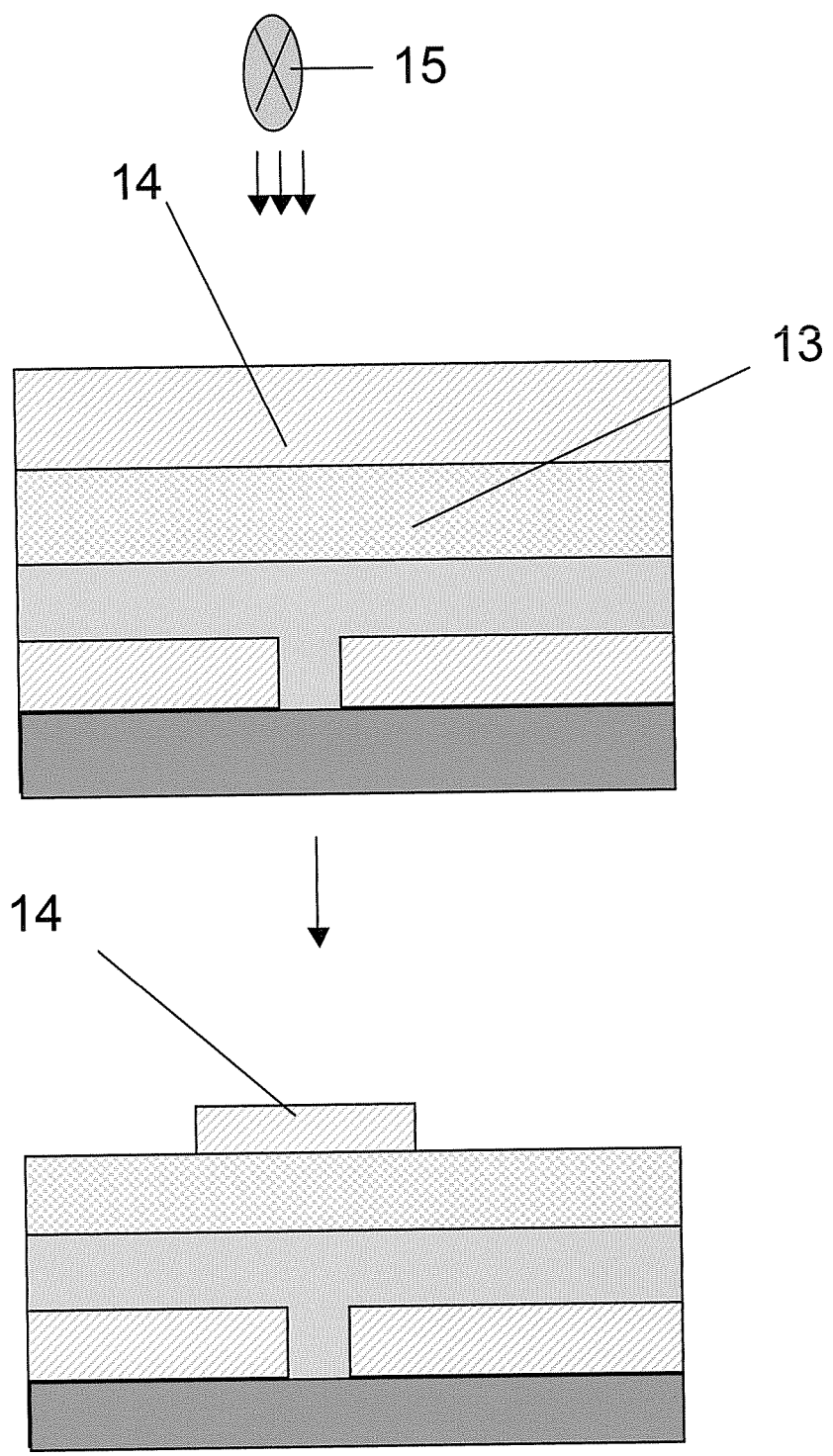
FIG. 9 shows a method of patterning a layer using multiple shots of an ultra-short pulse laser for the removal of thick layers of material for the fabrication of a thin film transistor (TFT)

FIG. 9 illustrates a further embodiment of the present invention, in which a thicker layer of metal is removed from the substrate surface by a multiple shot process. The laser pulse energy is sufficiently low for each shot of the laser to remove just a thin portion of the metal, typically a thickness of the order of 10 nm, although this will vary depending on the metal. This process therefore allows even thick layers of material to be patterned. This is in contrast to nanosecond pulse laser processes, where the increased thermal conduction in thicker metallic films results in difficulty in patterning metallic films above a thickness in the region of 150 nm. A pico-second laser or shorter laser avoids this problem as all of the energy from the laser beam enters the material before any significant conductive heating occurs. This therefore allows for very localised and shallow ablation in which multiple shots successively remove material from a substrate.

FIGS. 10 and 11 show process steps for the formation of a channel region of a transistor with a bottom gate configuration using ultra-fast laser ablation.

Referring to FIGS. 10 and 11, a substrate 1 is coated with a thin conductive layer 17 which will become a bottom gate electrode. Deposition of the conductive layer may be achieved using techniques such as sputtering, evaporation, ink jet printing or other deposition methods. As for a top gate electrode, suitable materials include a conductive polymer, such as polyethlylenedioxythiophene doped with polystyrene sulfonic acid (PEDOT/PSS), preferably, a metallic material such as printable inorganic nano-particles of silver, aluminium, copper or chrome, or preferably, a layer of gold. This layer is then patterned to form the gate electrode 17*a* of a bottom-gate thin film transistor. This patterning step may be performed by laser ablation, photolithography or other patterning methods. A dielectric layer 18 is then coated over the substrate by a technique such as ink jet printing, spin coating, vacuum deposition or another coating technique.

A second layer of metal 19 is then coated over the substrate, preferably using a sputtering technique, although other methods such as evaporation, spin coating and curing or electroless growth may also be employed. This may comprise any metal that adheres well to the substrate surface, but is preferably a layer of gold. An ultra-fast laser pulse 15 is then used to ablate the second gold layer to define regions which form the source and drain electrodes 19*a* and a channel 20. Use of an ultra-short pulse ensures little or no damage occurs to the underlying layers, maximizing the performance of the TFT. In addition to the ability of ablating thicker films by firing multiple shots the use of an ultra-short ps laser also reduces any burring effects at the edges of the source-drain electrode, which tend to lead to increased contact resistance. A solution-processable semiconductor layer 21 is then coated over the substrate, so that it connects the source and drain electrodes. If required this semiconductor layer can then be patterned again by a laser ablation process, or by other patterning techniques such as direct-write printing or photolithographic patterning.

A bottom-gate TFT configuration geometry has an advantage over the top-gate configuration in that it provides a lower contact resistance between the source/drain and channel regions. A second advantage is that the gate electrode is a low resolution feature and can be patterned by a wide range of techniques. The source and drain are most suited to patterning by laser ablation, and any slight burring on the upper edge of the ablated source and drain features will not significantly affect device performance since it is the lower edge that contributes to the transport.

Example 3

Achieving Selective Patterning of Upper Conductive Layers in Contact With an Underlying Organic Semiconductor Layer Here we describe an example of a method of ablating material of an upper conductive layer that is in contact with an active organic semiconductor layer. In this way cathode layers for organic diodes, or source-drain electrodes for bottom-gate, top-contact TFTs can be patterned by laser ablation without damage and degradation to the underlying active semiconducting layer.

Figure 12:
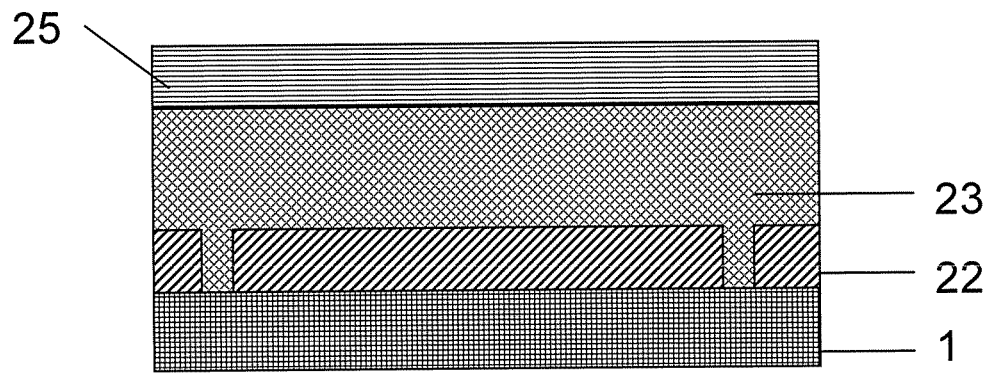
FIG. 12 illustrates the fabrication of a multi-layer stack for polymer-based rectifying diodes.
Figure 12:
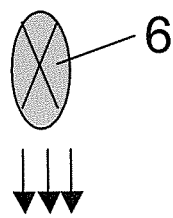
Figure 12:
Figure 12:
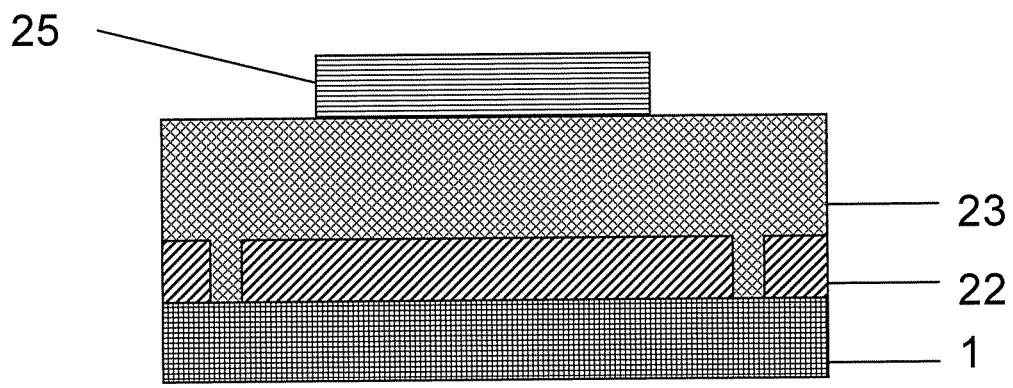

FIG. 12 illustrates fabrication of a multi-layer stack for polymer-based printed diodes. Conductive anode material is deposited and patterned on a substrate 1 to form the first injecting contact(s) 22 for the diode(s). The substrate may be a rigid substrate such as glass or a flexible substrate such as a plastic substrate, for example, polyethyleneterephtalate (PET) or polyethylenentaphtalene (PEN). The patterned conductive layer 22 may comprise a conducting polymer, such as PEDOT, or a metallic material, such as gold, silver or indium tin oxide (ITO). Multilayer structures, such as a thin film of conducting polymer on top of an ITO electrode may also be used. The anode material may be deposited and patterned using solution processing techniques such as, but not limited to, spin, dip, blade, bar, slot-die, or spray coating, inkjet, gravure, offset or screen printing. Alternatively, evaporation, and photolithography techniques may be employed.

Once a conductive layer has been patterned to form the lower electrode of the device, a layer of semiconducting material 23, or a sequence of layers may then be deposited over the substrate and may be patterned to isolate the individual diodes, if required. The semiconducting layer may comprise materials such as, but not limited to, polyarylamine, polyfluorene or polythiophene derivatives. A broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), offset printing, blade coating or dip coating, curtain coating, meniscus coating, spray coating, or extrusion coating. Alternatively, the semiconducting layer may be deposited as a thin continuous film and patterned subtractively by techniques such as photolithography (see WO 99/10939) or laser ablation. For certain applications patterning of the semiconducting layer may not be required.

The deposition of the semiconductor layer is then followed by the deposition of a second conductive layer to form a second injecting contact (cathode) 25 and, if required, interconnect lines. This upper electrode may comprise a thin film of inorganic metal such as copper, of a thickness suitable for the desired conductivity. In the case of rectifying diodes the metal preferably does not comprise the same material (or have the same work function) as the first injecting contact 22. In the case of light-emitting or light-sensing diodes the upper electrode preferably is a lower workfunction metal, such as aluminium, silver or calcium, which is able to inject electrons into the semiconducting layer, while the lower electrode is a higher workfunction metal such as ITO, PEDOT or gold. Inverted device configurations (with the cathode as the lower electrode) can also be used, although these tend to be harder to fabricate due to the reactive nature of many common, low workfunction metals.

The upper electrode may be deposited using techniques such as sputtering or evaporation techniques or solution processing techniques such as spin, dip, blade, bar, slot-die, gravure, offset or screen printing. The selective ablation process described below is more easily achieved for thin layers of metal than for thick layers. However, in many cases a minimum layer thickness is required in order to reach the necessary conductance for the interconnect lines. For a copper layer, a thickness of 50 nm provides a useful conductance for ensuring that the forward current in a circuit is not limited by the interconnect electrode.

The thin metallic layer 25 is preferably ablated using a single shot of 248 nm excimer laser 6 such as the Lumonics PM800 lasers (300 mJ, 30 W), although other wavelengths may also be used. The upper layer of the (preferably) copper material is removed upon firing a single shot from the laser, without causing any damage to the underlying metallic layers or the semiconductor layer and, in addition, very little debris is formed. This results in a clean process without the formation of excess debris. The fluence employed may be in the ranges primarily described and selected by routine experiment, based on the absorption coefficient, thickness and adhesion of the upper metal layers.

Figure 13A:
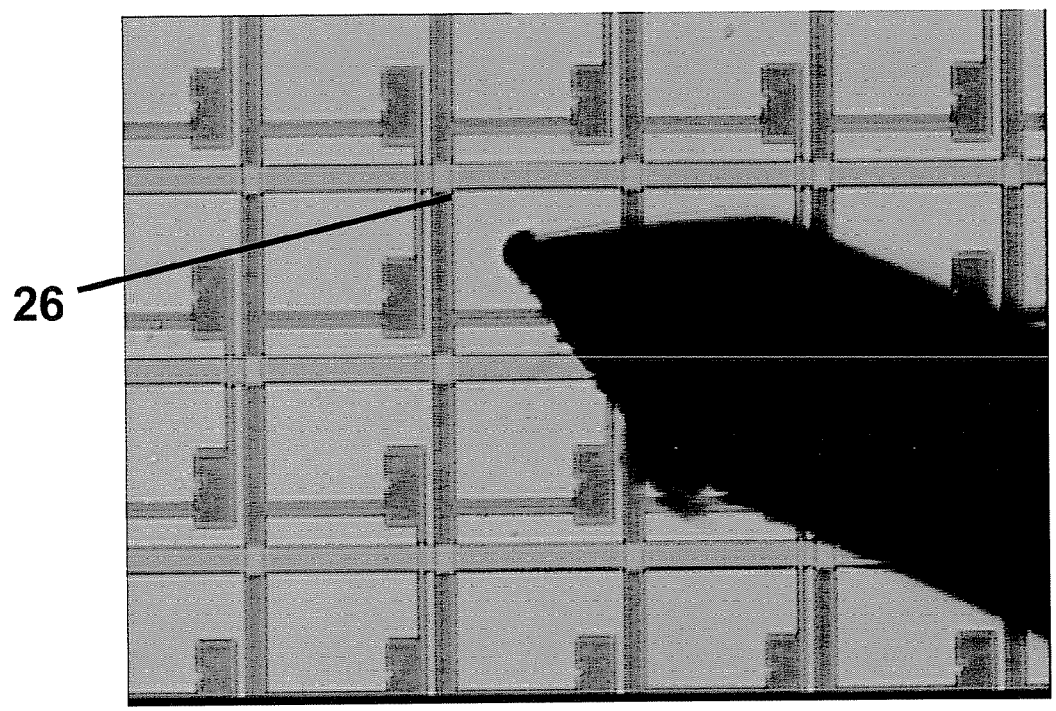
FIG. 13a shows a completed diode structure fabricated using a process of selective laser ablation patterning.

FIG. 13*a* shows a completed diode structure fabricated using the above described process. A PET substrate is coated with 50 nm of gold. A 270 nm layer of a polyfluorene semiconductor is then spin-coated over the surface and left unpatterned. A 40 nm copper layer is sputter-coated over the entire surface. Finally, a 248 nm Novaline 100 Laser (Lambda- Physik) is used to pattern the copper layer using single shots to pattern each region, with a fluence of 80 mJ cm$^{-2}$. The overlap of the remaining copper lines with the underlying gold pads forms the diode 26. Profilometry shows that no material from the semiconductor layer is ablated when the copper is removed.

Figure 13B:
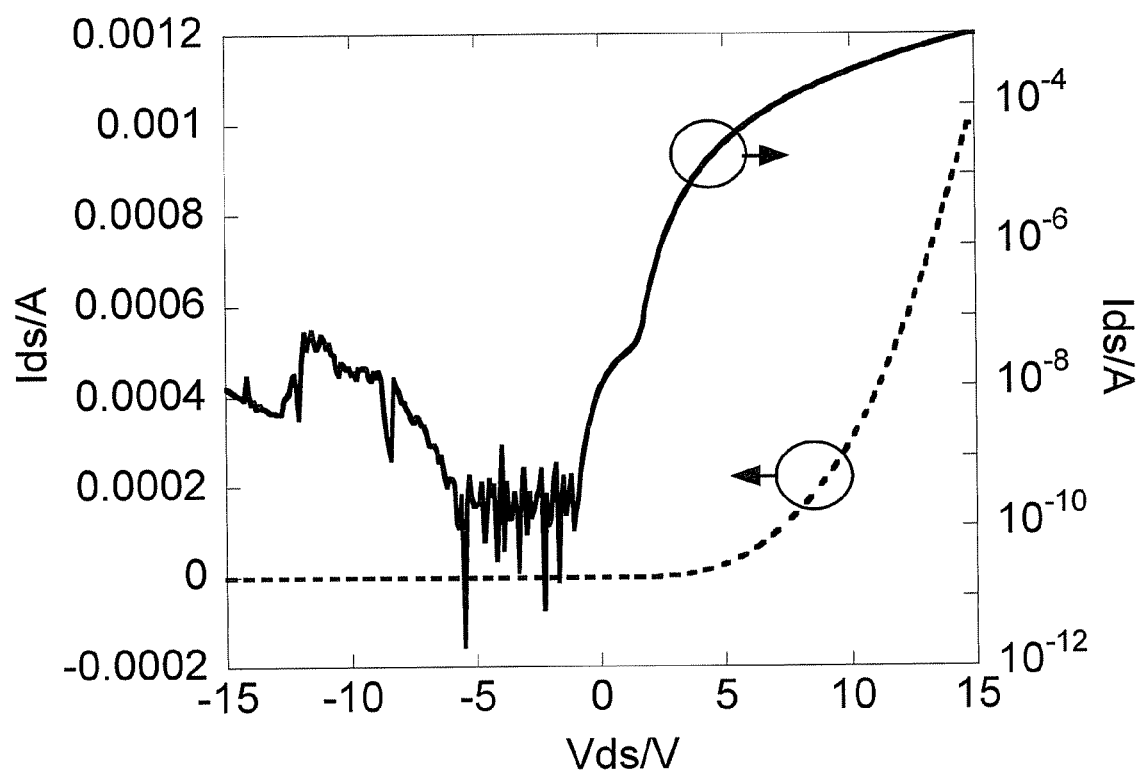
FIG. 13b shows the characteristics of a diode device fabricated using a laser ablation process.

FIG. 13*b* shows the resulting characteristics for a diode device fabricated using the above process (diode area 70 μm×450 μm). This corresponds to a forward current density of 3 A cm$^{-2}$ and a reverse current density of 30 μA cm$^{-2}$, measured at 15V, giving a rectification ratio of $10^5$. This result clearly shows that in spite of the direct contact between the upper conductive and the semiconducting layer, and the small thickness of the semiconducting layer, the semiconducting layer is not damaged or degraded by the single-shot laser ablation step.

In another example, diodes with rectification ratios of greater than $10^5$ at 15 volts were fabricated using a gold lower contact and a 50 nm copper upper contact, ablated at 80 mJ/cm$^2$ in a single shot. These results show that charge injection is substantially unaffected by the ablation.

Diode structures which may be fabricated by embodiments of the method include an (organic) light emitting diode (OLED) structure, a light sensing diode structure, and a rectifying diode structure.

Some possible explanations for the fact that the upper layer ablation process is self-limiting for one shot of the nanosecond laser beam have been given in the context of Example 1. Without wanting to be bound by theory similar explanations may apply in the present case.

The above-described processes of damage-free laser ablation using a pico-second laser and/or a nanosecond laser are not limited to patterning of metallic electrodes. Provided that the laser wavelength is selected to be strongly absorbed by the layer to be ablated, methods according to embodiments of this invention also allow patterning of semiconductor and dielectric layers on top of underlying electroactive layers, such as for example patterning of an active semiconducting layer of a TFT into an active layer island. Thus in the above-described aspects of the invention references to an upper conductive layer may be substituted by references to these types of layer.

The processes and devices described herein are not limited to devices fabricated with solution-processed polymers and vacuum-deposited metals. The conducting electrodes of the TFT and/or the interconnects in a circuit or display device (see below) may be formed from inorganic conductors that can, for example, be deposited by printing of a colloidal suspension or by electroplating onto a pre-patterned substrate, or from solution-process able conducting polymers For the semiconducting layer in the above described structures any solution process able conjugated polymeric or oligomeric material that exhibits adequate field-effect mobilities exceeding $10^{-3}$ cm$^2$/Vs, preferably exceeding $10^{-2}$ cm$^2$/Vs, may be used. Suitable materials are reviewed for example in H. E. Katz, J. Mater. Chen. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as nano-particle based materials, for example CdSe nano-particles (B. A. Ridley, et al., Science 286, 746 (1999)) or inorganic semiconductor nano-wires (X. Duan, Nature 425, 274 (2003)).

The electrodes may be coarse-patterned by techniques such as inkjet printing, soft lithographic printing (J. A. Rogers et al., Appl. Phys. Lett, 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, flexographic printing or other graphic arts printing techniques. Laser ablation processes according to embodiments of the present invention can be used to provide higher resolution patterning of these electrodes than that which is currently achievable with graphic arts printing techniques by trimming the edges of such coarsely patterned features.

Although preferably all layers and components of the device and circuit are deposited and patterned by solution processing and printing techniques, one or more components may also be deposited by vacuum deposition techniques and/or patterned by a photolithographic process.

Devices such as TFTs and diodes fabricated as described above may be part of a more complex circuit or device in which one or more such devices can be integrated with each other and/or with other devices. Examples of applications include logic circuits and active matrix circuitry for a display or a memory device, or a user-defined gate array circuit.

The patterning process may be used to pattern other active and passive components of such circuits such as OLEDs, solar cells, capacitors. The technique can for example be applied to patterning of upper level interconnects of a multi-level circuit.

The present invention is not limited to the foregoing examples. Aspects of the present invention include all novel and/or inventive aspects of the concepts described herein and all novel and/or inventive combinations of the features described herein.

The structures described above could be supplemented by other conductive and/or semiconductive structures on the same substrate, for example interconnects. Multiple structures as described above may be formed on the same substrate, and may be connected together by electrically conductive interconnects to form an integrated circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may comprise any such individual feature or combination of features. In view of the foregoing description it will be evident to a person skilled in the art that various modifications may be made within the scope of the invention.

What is claimed is:

1. A method of fabricating an organic electronic device, said organic electronic device having a structure including an inorganic metal upper conductive layer and an underlying layer immediately beneath said upper conductive layer, the method comprising patterning said upper conductive layer of said structure by:

laser ablating said inorganic metal upper conductive layer using a pulsed laser to remove a region of said inorganic metal upper conductive layer from said underlying layer for said patterning;

wherein said laser ablating uses a single pulse of said laser to substantially completely remove a said region of said inorganic metal upper conductive layer to expose said underlying layer beneath;

wherein the fluence of said laser pulse is greater than an ablation threshold of said underlying layer and wherein said inorganic metal upper conductive layer has an optical density greater than that of said underlying layer at a wavelength of said laser pulse; and wherein said underlying layer is substantially undamaged by said ablating wherein said underlying layer comprises a layer formed of an organic material; and wherein said inorganic metal upper conductive layer has an optical density greater than 1.

2. A method as claimed in claim 1 wherein said single pulse of said laser has a fluence of less than 200 mJ/cm$^2$.

3. A method as claimed in claim 1 wherein said single pulse of said laser has a duration of less than 100 ns.

4. A method as claimed in claim 3 wherein said single pulse of said laser has a duration of less than 10 ns.

5. A method as claimed in claim 1 wherein said inorganic metal upper conductive layer has a thickness of less than 500 nm.

6. A method as claimed in claim 1 wherein said inorganic metal upper conductive layer has a thickness of less than 50 nm and wherein said single laser pulse has a fluence of less than 100 mJ/cm$^2$.

7. A method as claimed in claim 1 wherein said inorganic metal upper conductive layer has a resistivity of less than 100 μΩcm.

8. A method as claimed in claim 1 wherein said structure includes one or more lower layers beneath said underlying layer, and wherein said fluence of said laser pulse is greater than an ablation threshold of one or more of said lower layers.

9. A method as claimed in claim 1 wherein said underlying layer has an optical density of less than 1 at a wavelength of said laser pulse.

10. A method as claimed in claim 1 wherein said underlying layer comprises a layer of organic dielectric material.

11. A method as claimed in claim 10, wherein said electronic device comprises a thin film transistor.

12. A method of fabricating a thin film field effect transistor (FET), using the method of claim 11, wherein said FET has a ratio of off resistance to on resistance of greater than 10$^4$.

13. A method as claimed in claim 12 wherein said FET has a ratio of off resistance to on resistance of greater than 10$^5$.

14. A method as claimed in claim 11, wherein said thin film transistor comprises a top gate field effect transistor.

15. A method as claimed in claim 1 wherein said underlying layer comprises a dielectric stack.

16. A method as claimed in claim 15 wherein said dielectric stack comprises a plurality of layers of dielectric material, and wherein one of said layers of dielectric material has a greater ablation threshold or absorption than one or more other dielectric material layers of said dielectric stack further from said inorganic metal upper conductive layer.

17. A method as claimed in claim 15 wherein said dielectric stack includes at least one layer of parylene.

18. A method as claimed in claim 1 wherein said underlying layer comprises a semiconducting layer, whereby said semiconducting layer is immediately beneath said upper conductive layer.

19. A method as claimed in claim 18 wherein said semiconducting layer has a thickness of at least 30 nm.

20. A method of fabricating a field effect transistor using the method of claim 18, wherein said electronic device comprises a bottom gate field effect transistor.

21. A method as claimed in claim 1 wherein the organic electronic device comprises an organic semiconducting layer beneath the upper conductive layer.

22. A method as claimed in claim 1 wherein said inorganic metal upper conductive layer comprises gold or copper.

23. A method as claimed in claim 1 wherein said laser has a wavelength of less than 400 nm and wherein said single laser pulse has a fluence of at least 10 mJ/cm$^2$.

24. A method as claimed in claim 1 wherein said laser comprises an Excimer laser.

25. A method of fabricating an organic electronic device on a flexible substrate using the method of claim 1, wherein said structure is flexible and supported on a flexible substrate.

26. An electronic device fabricated using the method of claim 1.

27. A method of fabricating a thin film transistor (TFT) active matrix display, sensing device, or logic circuit employing the method of claim 1.

28. A method of fabricating an organic electronic device on a flexible substrate, said organic electronic device having a structure including an inorganic metal upper conductive layer and an underlying layer immediately beneath said upper conducting layer, the method comprising patterning said inorganic metal upper conductive layer of said structure by:

laser ablating said inorganic metal upper conductive layer using a pulsed laser to remove a region of upper conductive layer from said underlying layer for said patterning, wherein said upper conductive layer has a first ablation threshold and a transmittance at a wavelength of said pulsed light;

wherein said laser ablating uses a single pulse of said laser to substantially completely remove said region of said inorganic metal upper conductive layer to expose said underlying layer beneath;

wherein said underlying layer has a second ablation threshold and wherein the second ablation threshold is greater than a product of the first ablation threshold and the transmittance and wherein the fluence of said laser pulse is greater than said second ablation threshold; and wherein said underlying layer is substantially undamaged by said ablating wherein said underlying layer comprises a layer formed of an organic material; and wherein said inorganic metal upper conductive layer has an optical density greater than 1.

29. A method as claimed in claim 28 wherein said inorganic metal upper conducting layer has a thickness of between 10 nm and 500 nm.

30. A method as claimed in claim 28 wherein said single laser pulse has a fluence of less than 600 mJ/cm$^2$.

31. A method as claimed in claim 28, wherein said underlying layer comprises a semiconducting layer whereby said semiconducting layer is immediately beneath said upper conductive layer.

32. A method of fabricating a thin film transistor (TFT) active matrix display, sensing device, or logic circuit employing the method of claim 28.

* * * * *